(12) United States Patent
Shiau

(10) Patent No.: US 12,315,758 B2
(45) Date of Patent: May 27, 2025

(54) SEMICONDUCTOR DEVICE AND METHOD

(71) Applicant: Taiwan Semiconductor Manufacturing Co., Ltd., Hsinchu (TW)

(72) Inventor: Yu-Cheng Shiau, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 479 days.

(21) Appl. No.: 17/729,546

(22) Filed: Apr. 26, 2022

(65) Prior Publication Data

US 2023/0238271 A1 Jul. 27, 2023

Related U.S. Application Data

(60) Provisional application No. 63/267,155, filed on Jan. 26, 2022.

(51) Int. Cl.
*H01L 21/762* (2006.01)
(52) U.S. Cl.
CPC ............... *H01L 21/76224* (2013.01)
(58) Field of Classification Search
None
See application file for complete search history.

(56) References Cited

U.S. PATENT DOCUMENTS

| | | | |
|---|---|---|---|
| 10,147,634 B2 | 12/2018 | Jhaveri et al. | |
| 11,817,343 B2 | 11/2023 | Peng | |
| 11,855,223 B2 | 12/2023 | Guha et al. | |
| 2007/0059898 A1* | 3/2007 | Shin | H01L 21/76229 257/E21.549 |
| 2012/0142198 A1 | 6/2012 | Wang et al. | |
| 2012/0276713 A1* | 11/2012 | Miyahara | H01L 21/76224 257/E21.546 |

(Continued)

FOREIGN PATENT DOCUMENTS

| CN | 105097519 A | * 11/2015 |
|---|---|---|
| CN | 113497119 A | 10/2021 |

(Continued)

OTHER PUBLICATIONS

Zhao et al (CN 105097519 A, Method For Forming A Semiconductor Structure) (Year: 2015).*

*Primary Examiner* — Khaja Ahmad
(74) *Attorney, Agent, or Firm* — Slater Matsil, LLP

(57) ABSTRACT

Methods for forming improved isolation features in semiconductor devices and semiconductor devices formed by the same are disclosed. In an embodiment, a method includes etching a first trench in a substrate; depositing a first insulation layer in the first trench with a first flowable chemical vapor deposition process; depositing a second insulation layer on the first insulation layer with a second flowable chemical vapor deposition process, the second flowable chemical vapor deposition process having process parameters different from the first flowable chemical vapor deposition process, and a portion of the first trench remaining unfilled by the first insulation layer and the second insulation layer; and forming an insulating fin in the portion of the first trench unfilled by the first insulation layer and the second insulation layer.

20 Claims, 29 Drawing Sheets

(56) References Cited

U.S. PATENT DOCUMENTS

| | | | | |
|---|---|---|---|---|
| 2014/0231919 | A1* | 8/2014 | Peng | H01L 21/845 257/368 |
| 2017/0018452 | A1* | 1/2017 | Dou | H01L 21/823481 |
| 2019/0131186 | A1* | 5/2019 | Chung | H01L 21/823807 |
| 2020/0105583 | A1* | 4/2020 | Wang | H01L 21/823418 |
| 2020/0411681 | A1* | 12/2020 | Su | H01L 21/823431 |
| 2022/0029011 | A1 | 1/2022 | Kao et al. | |
| 2022/0208984 | A1 | 6/2022 | Tang et al. | |

FOREIGN PATENT DOCUMENTS

| | | |
|---|---|---|
| DE | 102016121443 A1 | 2/2018 |
| DE | 102019118467 A1 | 4/2020 |
| DE | 102021101880 A1 | 1/2022 |
| KR | 20160100929 A | 8/2016 |
| KR | 20210056973 A | 5/2021 |
| TW | 202015236 A | 4/2020 |

\* cited by examiner

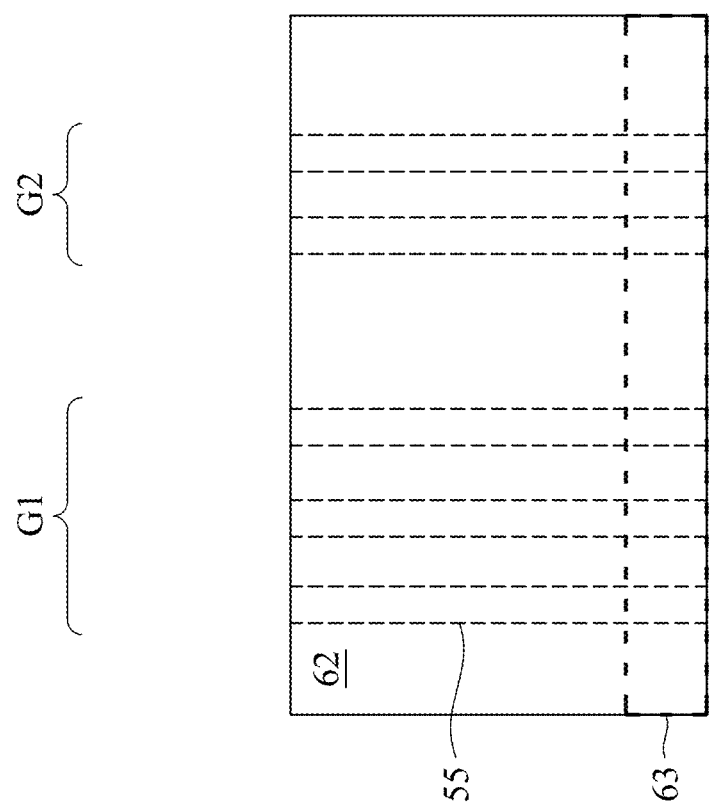

SEMICONDUCTOR DEVICE AND METHOD

PRIORITY CLAIM AND CROSS-REFERENCE

This application claims the benefit of U.S. Provisional Application No. 63/267,155, filed on Jan. 26, 2022, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7, 8, 9, 10, 11A, 11B, 12A, 12B, 12C, 13A, 13B, 13C, 14A, 14B, 14C, 15A, 15B, 15C, 15D, 16A, 16B, 17A, 17B, 18A, 18B, 19A, 19B, 20A, 20B, 21A, 21B, 22, 23A, and 23B are cross-sectional views of intermediate stages in the manufacturing of semiconductor devices, in accordance with some embodiments.

DETAILED DESCRIPTION

Figure 1:
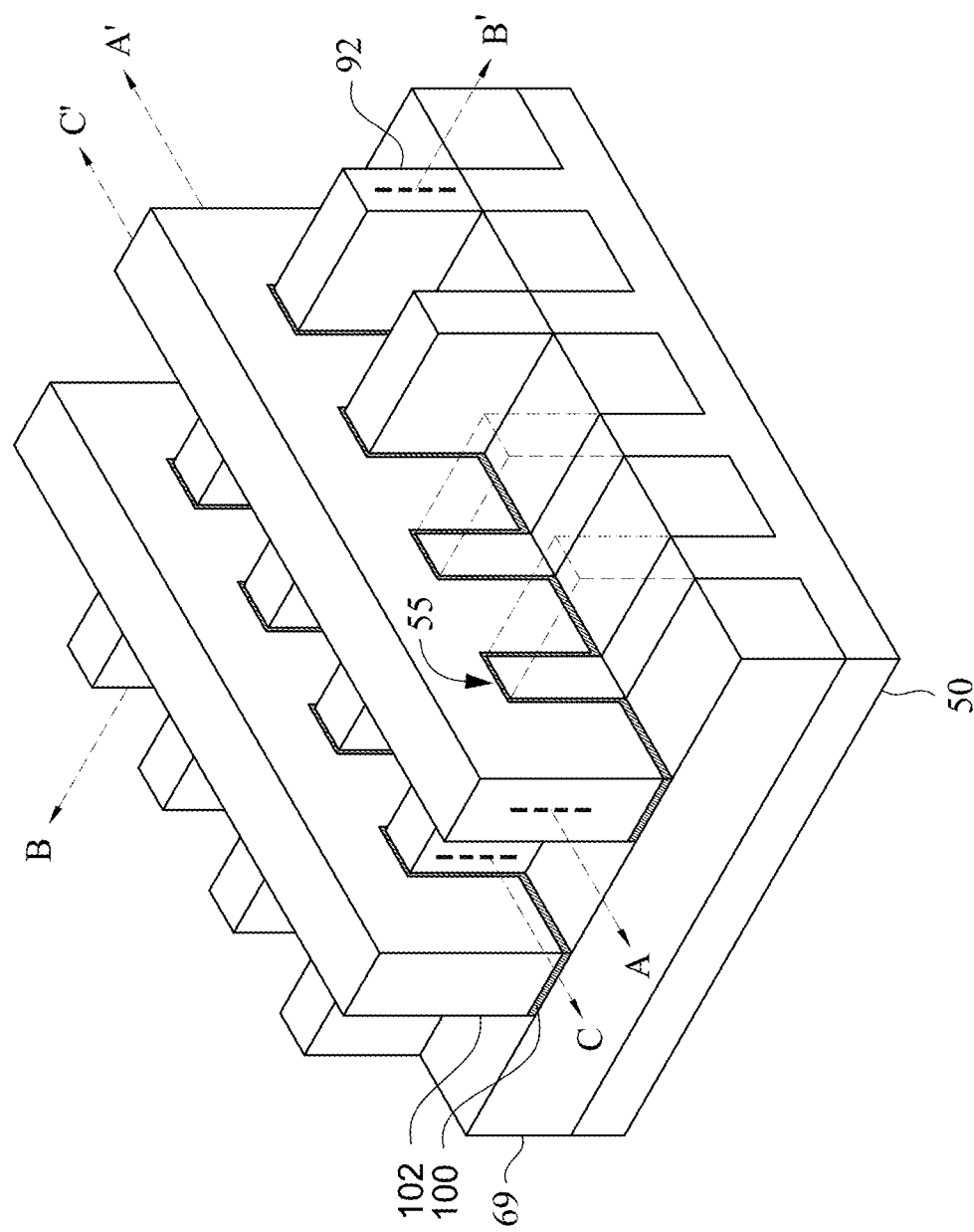
FIG. 1 illustrates an example of a semiconductor device including fin field-effect transistors (FinFETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a method for forming improved isolation features in semiconductor devices and semiconductor devices formed by said methods. The method includes forming semiconductor fins on a semiconductor substrate and forming an isolation structure on the semiconductor fins. The isolation structure may be formed by depositing a first isolation layer on the semiconductor substrate and depositing a second isolation layer on the first isolation layer. The first isolation layer and the second isolation layer may be deposited by flowable chemical vapor deposition (FCVD) processes. The first isolation layer and the second isolation layer may be deposited using different process parameters. Specifically, one of the first isolation layer or the second isolation layer is deposited using process parameters that result in a more conformal layer and the other of the first isolation layer or the second isolation layer is deposited using process parameters that result in a layer having better gap-filling. Forming the isolation structure using this two-step deposition process results in the isolation structure filling first trenches adjacent to some of the semiconductor fins, while second trenches adjacent to others of the semiconductor fins are unfilled and have a reduced thickness of the isolation structure. This reduces device defects caused by insufficient gap-filling of the first trenches, while allowing larger insulating fins (also referred to as hybrid fins or dielectric fins) to be formed in the second trenches, which improves device performance.

FIG. 1 illustrates an example of FinFETs, in accordance with some embodiments. The FinFETs comprise fins 55 on a substrate 50 (e.g., a semiconductor substrate). Shallow trench isolation (STI) regions 69 are disposed in the substrate 50 and the fins 55 protrude above and from between neighboring STI regions 69. Although the STI regions 69 are described/illustrated as being separate from the substrate 50, as used herein the term "substrate" may be used to refer to the semiconductor substrate alone, or a semiconductor substrate inclusive of STI regions. Additionally, although the fins 55 are illustrated as single, continuous materials with the substrate 50, the fins 55 and/or the substrate 50 may comprise a single material or a plurality of materials. In this context, the fins 55 refer to the portions extending between the neighboring STI regions 69.

Gate dielectric layers 100 extend along sidewalls and on top surfaces of the fins 55, and gate electrodes 102 extend on the gate dielectric layers 100. Epitaxial source/drain regions 92 (e.g., source regions and/or drain regions) are disposed on opposite sides of the fins 55, the gate dielectric layers 100, and the gate electrodes 102. FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of the FinFETs. Cross-section B-B' is perpendicular to cross-section A-A' and is along a longitudinal axis of a fin 55 and in a direction of, for example, the current flow between the epitaxial source/drain regions 92 of the FinFETs. Cross-section C-C' is parallel to cross-section A-A' and extends through the epitaxial source/drain regions 92 of the FinFETs. Subsequent figures refer to these reference cross-sections for clarity.

Some embodiments discussed herein are discussed in the context of fin field effect transistors (FinFETs) formed using gate-last processes. In some embodiments, a gate-first process may be used. Some embodiments contemplate aspects used in planar devices (e.g., planar field effect transistors), nanostructure (e.g., nanosheet, nanowire, gate-all-around, or the like) field effect transistors (nano-FETs), or the like.

FIGS. 2 through 23B are cross-sectional views of intermediate stages in the manufacturing of FinFETs, in accordance with some embodiments. FIGS. 2 through 5, 6A, 7-10, 11A, 12A, 13A, 14A, 15A, 16A, 17A, 18A, 19A, 20A, 21A, 22, and 23A are illustrated along reference cross-section A-A' illustrated in FIG. 1. FIGS. 11B, 12B, 13B, 14B, 15B, 16B, 17B, 18B, 19B, 20B, 21B, and 23B are illustrated along a similar cross-section B-B' illustrated in FIG. 1. FIGS. 12C, 13C, 14C, 15C, and 15D are illustrated along reference cross-section C-C' illustrated in FIG. 1. FIG. 6B is a top-down view.

Figure 2:
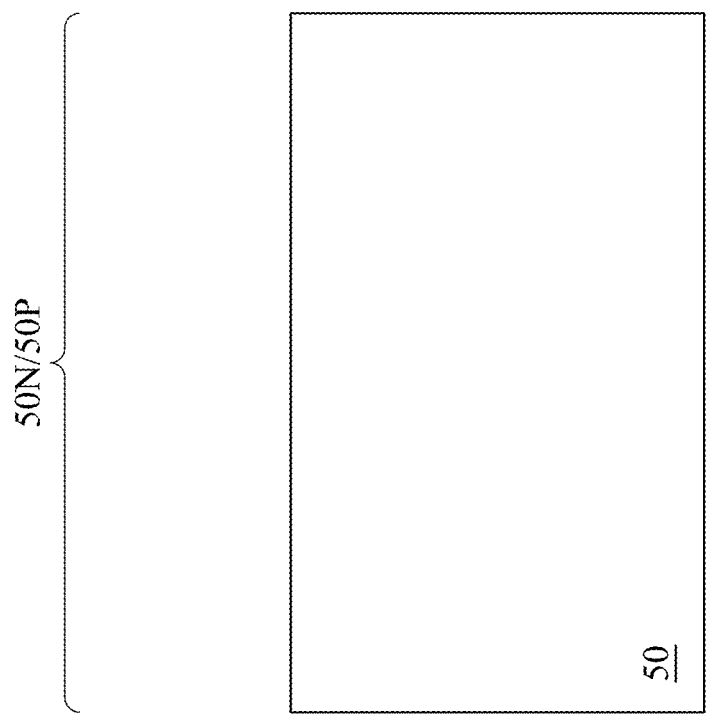

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 includes an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P, and any number of device features (e.g., other active devices, doped regions, isolation structures, etc.) may be disposed between the n-type region 50N and the p-type region 50P. FIGS. 3 through 23B illustrate features in either of the n-type region 50N or the p-type region 50P. For example, the structures illustrated in FIGS. 3 through 23B may be applicable to both the n-type region 50N and the p-type region 50P. Differences (if any) in the structures of the n-type region 50N and the p-type region 50P are described in the text accompanying each figure.

Figure 3:
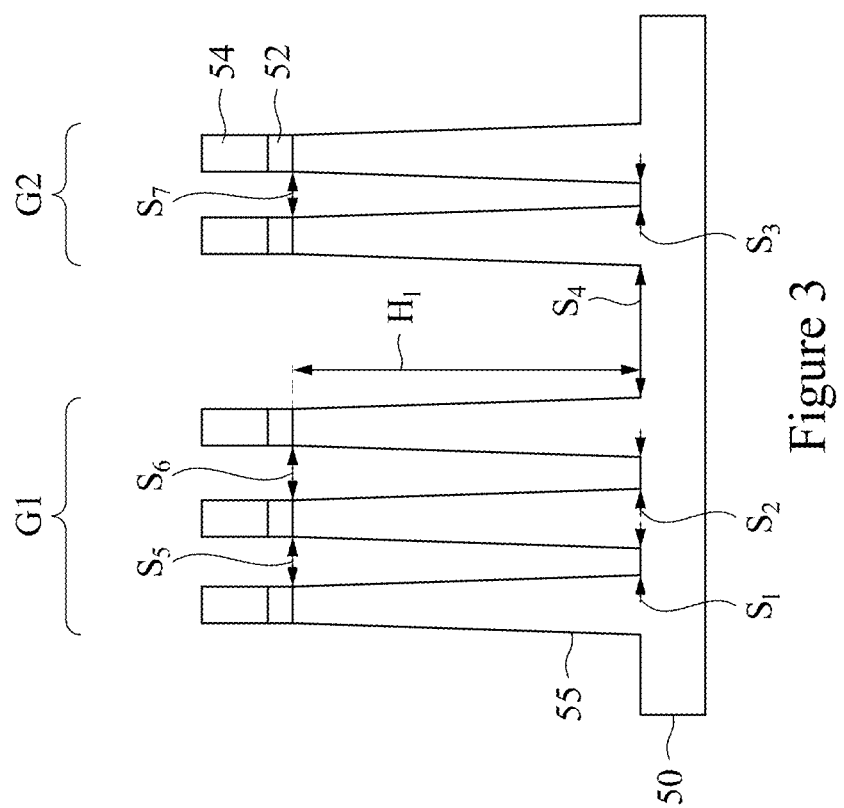

In FIG. 3, a first mask layer 52 and a second mask layer 54 are formed on the substrate 50 and fins 55 are formed in the substrate 50. The first mask layer 52 and the second mask layer 54 may comprise oxides, nitrides, oxynitrides, or the like. In some embodiments, the first mask layer 52 comprises an oxide material, such as silicon dioxide or the like, and may be formed using atomic layer deposition (ALD), chemical vapor deposition (CVD), a combination thereof, or the like. In some embodiments, the second mask layer 54 comprises a nitride material, such as silicon nitride or the like, and may be formed using ALD, CVD, a combination thereof, or the like. The first mask layer 52 and the second mask layer 54 may be used to aid in patterning the substrate 50 to form the fins 55. In some embodiments, the first mask layer 52 and/or the second mask layer 54 may be omitted.

The first mask layer 52, the second mask layer 54, and the substrate 50 are patterned by a patterning process to form the fins 55 and trenches adjacent the fins 55. The fins 55 are semiconductor strips. In some embodiments, first mask layer 52 and the second mask layer 54 may be patterned and then used as masks to pattern the fins 55 in the substrate 50. The patterning process may comprise a first patterning process followed by a second patterning process. In some embodiments, the first patterning process is performed on the first mask layer 52 and the second mask layer 54 to form a desired pattern in the first mask layer 52 and the second mask layer 54. The first patterning process may comprise suitable photolithography and etch processes. The etch processes may be any acceptable etch processes, such as a reactive ion etch (RIE), a neutral beam etch (NBE), a combination thereof, or the like. The etch processes may be anisotropic.

Subsequently, the second patterning process is performed on the substrate 50 to transfer the pattern of the first mask layer 52 and the second mask layer 54 into the substrate 50. The second patterning process may comprise a suitable etch process, while using the first mask layer 52 and the second mask layer 54 as an etch mask. The etch process may be any acceptable etch process, such as RIE, NBE, a combination thereof, or the like. The etch process may be anisotropic.

The spacing between each of the fins 55 (e.g., the widths of trenches formed adjacent the fins 55) may vary. For example, a spacing $S_1$ between bottom side surfaces (e.g., at a point at which the fins 55 meet a bulk material of the substrate 50) of the fins 55 may be in a range from about 3.5 nm to about 4.5 nm, a spacing $S_2$ between bottom side surfaces of the fins 55 may be in a range from about 3 nm to about 4 nm, and a spacing $S_3$ between bottom side surfaces of the fins 55 may be in a range from about 2 nm to about 3 nm. In some embodiments, the fins 55 may be grouped into fin groups (such as fin groups G1 and G2 illustrated in FIG. 3), with the fin groups being separated by a spacing $S_4$ between bottom side surfaces of the fins 55, which may be in a range from about 40 nm to about 120 nm. A spacing $S_5$ between top side surfaces (e.g., at a level with top surfaces of the fins 55) of the fins 55 may be in a range from about 7.5 nm to about 9.5 nm, a spacing $S_6$ between top side surfaces of the fins 55 may be in a range from about 5.5 nm to about 7.5 nm, and a spacing $S_7$ between top side surfaces of the fins 55 may be in a range from about 3.5 nm to about 5.5 nm. The fins 55 may have heights $H_1$ in a range from about 80 nm to about 140 nm.

A ratio of the heights $H_1$ of the fins 55 to the spacing $S_4$ between the fin groups may be in a range from about 1 to about 3. A ratio of the heights $H_1$ of the fins 55 to the spacing $S_1$ may be in a range from about 18 to about 35. A ratio of the heights $H_1$ of the fins 55 to the spacing $S_2$ and $S_3$ may be in a range from about 20 to about 70. As will be discussed in detail below, improved methods are provided to deposit insulation layers (such as the first insulation layer 56 and the second insulation layer 58, discussed below with respect to FIG. 4) on the fins 55 and the substrate 50. The insulation layers may be deposited to fill the trenches between fins 55 within the fin groups G1/G2, while providing a minimal thickness of the insulation layers between the fin groups G1 and G2. This prevents undesired materials from being deposited between the fins 55 within the fin groups G1/G2, while maximizing the size of insulating fins (such as the insulating fins 67, discussed below with respect to FIG. 8)

formed between the fin groups G1 and G2, both of which reduce device defects and improve device performance.

The above method for forming the fins 55 is merely an example method for forming the fins 55. The fins 55 may be formed by any suitable method. For example, the fins 55 may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed on a substrate and patterned using a photolithography process. Spacers are formed alongside the patterned sacrificial layer using a self-aligned process. The sacrificial layer is then removed, and the remaining spacers may then be used as a mask to form the fins 55. In some embodiments, the mask (or other layer) may remain on the fins 55.

Figure 4:
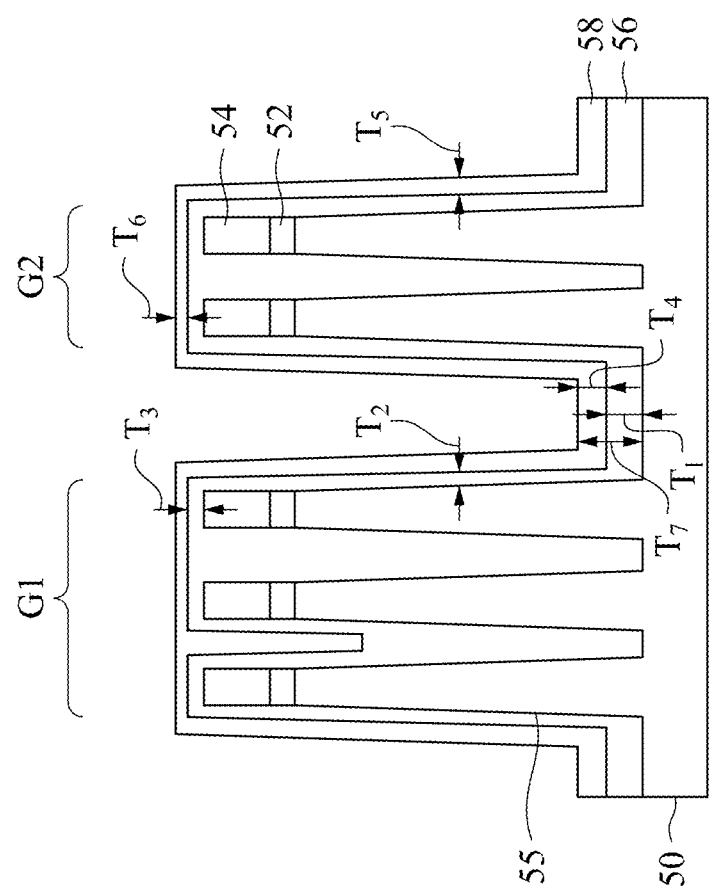

In FIG. 4, a first insulation layer 56 is deposited on the fins 55, the first mask layer 52, the second mask layer 54, and the substrate 50 and a second insulation layer 58 is deposited on the first insulation layer 56. The first insulation layer 56 and the second insulation layer 58 may be oxides, nitrides, oxynitrides, combinations thereof, or the like. In some embodiments, either of the first insulation layer 56 and the second insulation layer 58 may include silicon dioxide ($SiO_2$), silicon nitride ($Si_3N_4$), silicon oxynitride (SiON), or the like. The first insulation layer 56 and the second insulation layer 58 may be deposited by flowable CVD (FCVD) processes (e.g., contouring FCVD processes) or the like. FCVD processes are a CVD-based material deposition in a remote plasma system followed by a post-deposition cure to convert the deposited material to another material, such as an oxide. The first insulation layer 56 and the second insulation layer 58 may be deposited as silicon nitride or silicon oxynitride and converted to silicon oxide by the post-deposition cure.

Process parameters used to deposit the first insulation layer 56 and the second insulation layer 58 may be different from one another. For example, the first insulation layer 56 may be deposited by an FCVD process that deposits material with a relatively higher viscosity, a higher flowability, and better gap-filling. The first insulation layer 56 may be deposited in a bottom-up manner. This helps the first insulation layer 56 to fill the trenches between the fins 55 within the fin groups G1 and G2, but also increases the thickness of the first insulation layer 56 on the substrate 50 between the fin groups G1 and G2. The second insulation layer 58 may be deposited by an FCVD process that deposits material with a relatively lower viscosity and as a more conformal layer. This helps to fill the remaining portions of the trenches between the fins 55 within the fin groups G1 and G2, while keeping the combined thickness of the first insulation layer 56 and the second insulation layer 58 on the substrate 50 between the fin groups G1 and G2 to a minimum. By using FCVD to deposit both the first insulation layer 56 and the second insulation layer 58, the first insulation layer 56 and the second insulation layer 58 are deposited without voids or seams. This prevents undesired materials from filling any voids or seams in the first insulation layer 56 and the second insulation layer 58, which reduces device defects and improves device performance. Using different process parameters to deposit the first insulation layer 56 and the second insulation layer 58 further ensures a small thickness of the first insulation layer 56 and the second insulation layer 58 on the substrate 50 between the fin groups G1 and G2, which allows for larger insulating fins to be formed between the fin groups G1 and G2. This further improves device performance.

The FCVD processes used to deposit the first insulation layer 56 and the second insulation layer 58 may include exposing the fins 55, the first mask layer 52, the second mask layer 54, and the substrate 50 to a silicon-containing precursor and a nitrogen-containing precursor. In some embodiments, the silicon-containing precursor is a polysilazane, which may include silicon and nitrogen atoms in an alternating sequence having the formula $[R_1R_2Si—NR_3]_n$. In some embodiments, the silicon-containing precursor is a silylamine, such as trisilylamine (TSA), disilylamine (DSA), combinations thereof, or the like. One or more carrier gases may also be included with the silicon-containing precursor. The carrier gases may include helium (He), argon (Ar), nitrogen ($N_2$), combinations thereof, or the like.

The nitrogen-containing precursor may include ammonia ($NH_3$), nitrogen ($N_2$), a combination thereof, or the like. In some embodiments, the nitrogen-containing precursor is activated into plasma (e.g., containing NH*, $NH_2$*, combinations thereof, or the like) in a remote plasma system (RPS) outside of the deposition chamber used to deposit the first insulation layer 56 and the second insulation layer 58. An oxygen source gas, such as $O_2$ or the like, may be included with the nitrogen-containing precursor and activated into plasma in the RPS. Plasma generated in the RPS is carried into the deposition chamber by a carrier gas, which may include helium (He), argon (Ar), nitrogen ($N_2$), combinations thereof, or the like.

The first insulation layer 56 is deposited on the fins 55, the first mask layer 52, the second mask layer 54, and the substrate 50. The silicon-containing precursor and the nitrogen-containing precursor mix and react to deposit the first insulation layer 56 on the fins 55, the first mask layer 52, second mask layer 54, and the substrate 50. In some embodiments, the silicon-containing precursor is dispensed at a flow rate in a range from about 800 sccm to about 1000 sccm and the nitrogen-containing precursor is dispensed at a flow rate in a range from about 40 sccm to about 80 sccm. A ratio of the flow rate of the nitrogen-containing precursor to the flow rate of the silicon-containing precursor may be in a range from about 0.04 to about 0.10. The FCVD process may be performed at a low pressure. For example, the deposition chamber may be maintained at a pressure ranging from about 0.4 Torr to about 0.9 Torr. In some embodiments, the deposition chamber is maintained at a temperature in a range from about 55° C. to about 85° C., the substrate 50 on which the first insulation layer 56 is deposited is maintained at a temperature in a range from about 55° C. to about 85° C., and the deposition rate of the first insulation layer 56 may be in a range from about 2 Å/s to about 10 Å/s. Performing the FCVD process with the specified process conditions (e.g., precursor flow rates, pressure, temperature, etc.) allows the flowable material to be deposited with a high viscosity (previously described). This helps to fill the trenches between the fins 55 within the fin groups G1 and G2 in a bottom-up manner and with improved gap filling. The first insulation layer 56 may be deposited with a thickness $T_1$ on the substrate in a range from about 5 nm to about 10 nm, a thickness $T_2$ on side surfaces of the fins 55 in a range from about 2 nm to about 4 nm, and a thickness $T_3$ on top surfaces of the second mask layer 54 in a range from about 2 to about 4 nm.

As illustrated in FIG. 4, the first insulation layer 56 may fill some of the trenches between the fins 55 within the fin groups G1 and G2, while others of the trenches between the fins 55 within the fin groups G1 and G2 remain unfilled. The first insulation layer 56 may fill trenches having a ratio of the heights $H_1$ of the fins 55 to the spacing $S_2$ and $S_3$ (see FIG. 3) in a range from about 20 to about 70, while trenches having a ratio of the heights $H_1$ of the fins 55 to the spacing $S_1$ (see FIG. 3) in a range from about 18 to about 35 remain at least partially unfilled.

The second insulation layer 58 is deposited on the first insulation layer 56. The silicon-containing precursor and the nitrogen-containing precursor mix and react to deposit the second insulation layer 58 on the first insulation layer 56. In some embodiments, the silicon-containing precursor is dispensed at a flow rate in a range from about 800 sccm to about 1000 sccm and the nitrogen-containing precursor is dispensed at a flow rate in a range from about 20 sccm to about 30 sccm. A ratio of the flow rate of the nitrogen-containing precursor to the flow rate of the silicon-containing precursor may be in a range from about 0.02 to about 0.04. The FCVD process may be performed at a low pressure. For example, the deposition chamber may be maintained at a pressure ranging from about 0.4 Torr to about 0.9 Torr. In some embodiments, the deposition chamber is maintained at a temperature in a range from about 55° C. to about 85° C., the substrate 50 on which the second insulation layer 56 is deposited is maintained at a temperature in a range from about 55° C. to about 85° C., and the deposition rate of the second insulation layer 56 may be in a range from about 2 Å/s to about 10 Å/s. Performing the FCVD process with the specified process conditions (e.g., precursor flow rates, pressure, temperature, etc.) allows the flowable material to be deposited as a conformal layer. This helps to fill the trenches between the fins 55 within the fin groups G1 and G2, while maintaining a minimal thickness of the second insulation layer 58 on the substrate 50 between the fin groups G1 and G2. The second insulation layer 58 may be deposited with a thickness $T_4$ on the substrate in a range from about 5 nm to about 8 nm, a thickness $T_5$ on side surfaces of the fins 55 in a range from about 2 nm to about 4 nm, and a thickness $T_6$ on top surfaces of the second mask layer 54 in a range from about 2 to about 4 nm. A thickness $T_7$ of the first insulation layer 56 and the second insulation layer 58 on the substrate 50 between the fin groups G1 and G2 may be in a range from about 10 nm to about 18 nm. As illustrated in FIG. 4, the first insulation layer 56 and the second insulation layer 58 fill the trenches between the fins 55 within the fin groups G1 and G2.

The first insulation layer 56 and the second insulation layer 58 may be deposited as flowable materials, which are then cured to form solid dielectric materials. The first insulation layer 56 and the second insulation layer 58 may be cured simultaneously after depositing the second insulation layer 58, or the first insulation layer 56 may be cured before depositing the second insulation layer 58. The first insulation layer 56 and the second insulation layer 58 may be cured by an anneal process, which may be an oxidation process. The oxidation process may include an anneal in an oxygen containing ambient (e.g., steam). The conversion process may convert the first insulation layer 56 and the second insulation layer 58 to oxides, such as silicon oxide (SiOx). In some embodiments, the anneal process may be a wet thermal anneal process performed at a temperature in a range from about 300° C. to about 700° C., and for a duration of several hours. In some embodiments, the wet thermal anneal process may be performed at a pressure in a range from about 400 Torr to about 760 Torr. In some embodiments, the wet anneal includes wet steam that may be generated by use of a water vapor generator, a water vaporizer, or combining hydrogen and oxygen gases in a torch unit.

It is appreciated that depending on the material and the composition (elements and the percentage of elements), the second insulation layer 58 may be, or may not be, distinguishable from the first insulation layer 56. For example, either of the first insulation layer 56 and the second insulation layer 58 may or may not include elements such as carbon, hydrogen, nitrogen, or the like in additional to silicon and oxygen. Furthermore, the density of the second insulation layer 58 may be lower than, equal to, or higher than that of the first insulation layer 56. The distinction between the second insulation layer 58 and the first insulation layer 56 may be achieved by determining the elements and the corresponding atomic percentages of the elements in these layers/materials, for example, by using X-ray Photoelectron Spectroscopy (XPS).

Figure 5:
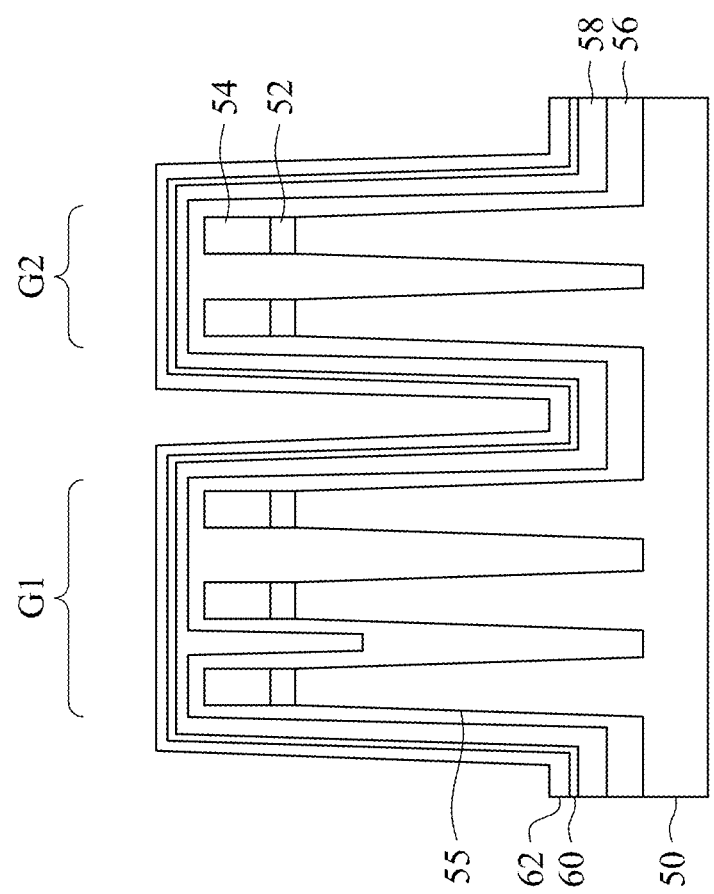
Figure 6A:
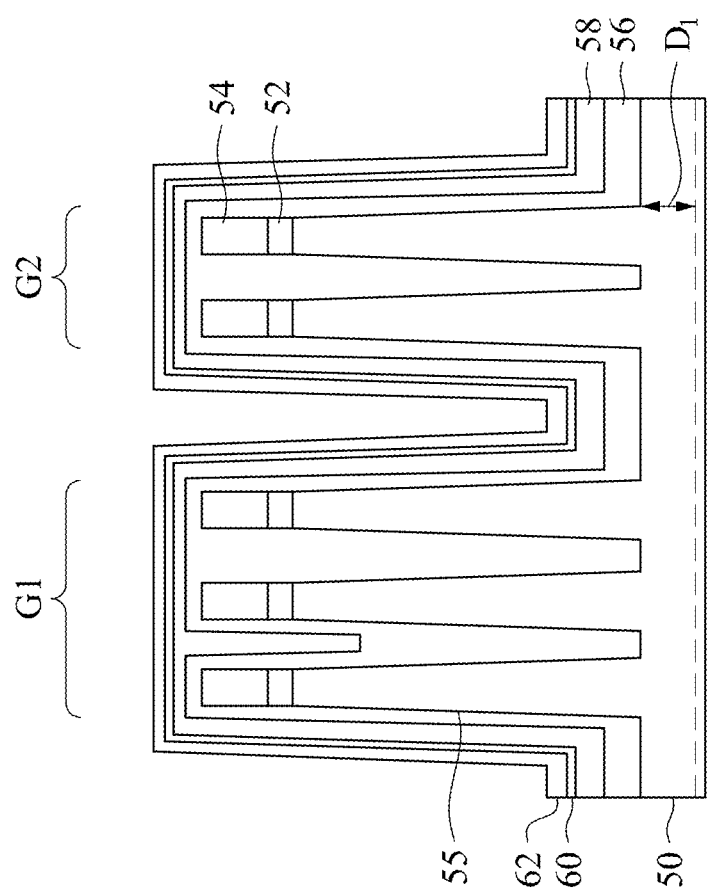

In FIG. 5, a third insulation layer 60 and a fourth insulation layer 62 are formed on the second insulation layer 58. The third insulation layer 60 and the fourth insulation layer 62 may be deposited by conformal deposition processes, such as ALD, CVD, physical vapor deposition (PVD), or the like. The third insulation layer 60 may be formed of an oxide, such as silicon dioxide, and may be provided to adjust a sidewall thickness and profile of the first insulation layer 56 and the second insulation layer 58. The third insulation layer 60 may have a thickness in a range from about 2 nm to about 5 nm. The third insulation layer 60 is optional and may be omitted in some embodiments.

The fourth insulation layer 62 may be formed of one or more dielectric material(s) having a high etch selectivity from the etching of the fins 55, the first insulation layer 56, the second insulation layer 58, and the third insulation layer 60. For example, the fourth insulation layer 62 may include as silicon nitride, silicon carbonitride, silicon oxycarbonitride, or the like. The fourth insulation layer 62 may be used to protect subsequently formed insulating fins from etching of the first insulation layer 56, the second insulation layer 58, and the third insulation layer 60.

In FIGS. 6A and 6B, a cut process is performed on the fins 55 and a clean process is performed. The cut process may be performed a cut region 63 illustrated in FIG. 6B. The cut process may be an anisotropic etch process, such as a dry etch process. The cut process may be used to cut the fins 55 to desired lengths. The cut process may cut through the fins 55 and into the substrate 50 to a depth $D_1$ in the substrate 50 ranging from about 30 nm to about 40 nm below bottom extents of the fins 55 and a major surface of the substrate 50. The cut process may expose side surfaces of the fins 55, the substrate 50, the first mask layer 52, the second mask layer 54, the first insulation layer 56, the second insulation layer 58, the third insulation layer 60, and the fourth insulation layer 62. The clean process may then be performed to remove any residues remaining from the cut process. For example, an oxide removal using, for example, dilute hydrofluoric (dHF) acid may be used. In some embodiments, the clean process may use dHF, which includes a ratio of HF:DI water of about 1:100 for a period in a range of about 5 seconds to about 15 seconds.

The fourth insulation layer 62 may be used to protect the underlying first insulation layer 56, second insulation layer 58, and third insulation layer 60 from the clean process. If the first insulation layer 56 and the second insulation layer 58 are formed with seams, the dHF used in the clean process may penetrate into the first insulation layer 56 and the second insulation layer 58 from the sides, expanding the seams to create voids in the first insulation layer 56 and the second insulation layer 58. These voids may subsequently be filled with undesired materials, which may cause device defects and reduce device performance. Forming the first insulation layer 56 and the second insulation layer 58 using the FCVD processes described above prevents the formation of seams in the first insulation layer 56 and the second insulation layer 58, which reduces device defects and improves device performance.

Figure 7:
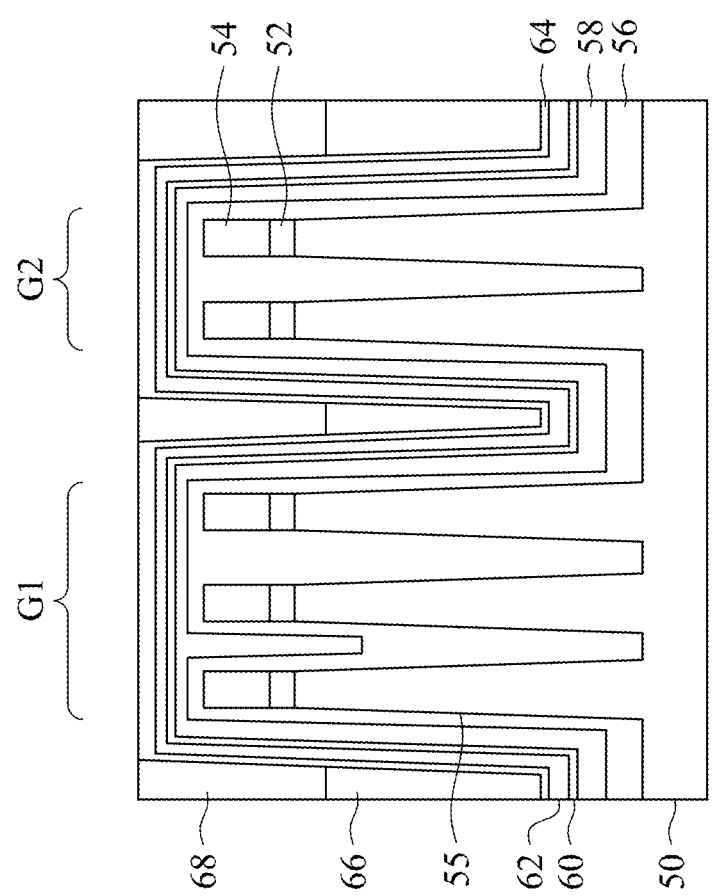

In FIG. 7, a fifth insulation layer 64, a first insulation material 66, and a second insulation material 68 are formed on the fourth insulation layer 62. The fifth insulation layer 64 may be deposited by conformal deposition processes, such as ALD, CVD, physical vapor deposition (PVD), or the like. The fifth insulation layer 64 may be formed of one or more dielectric material(s) having a high etch selectivity from the etching of the fins 55, the first insulation layer 56, the second insulation layer 58, and the third insulation layer 60. For example, the fifth insulation layer 64 may include as silicon nitride, silicon carbonitride, silicon oxycarbonitride, or the like. In some embodiments, the fifth insulation layer 64 may include the same materials as the fourth insulation layer 62. The fifth insulation layer 64 may be used to protect subsequently formed insulating fins from etching of the first insulation layer 56, the second insulation layer 58, and the third insulation layer 60.

In devices in which seams or voids are present in the first insulation layer 56 and the second insulation layer 58, the fifth insulation layer 64 may be deposited in the seams or voids through side surfaces exposed during the cut process discussed above with respect to FIGS. 6A and 6B. However, by forming the first insulation layer 56 and the second insulation layer 58 according to the FCVD processes discussed above, the first insulation layer 56 and the second insulation layer 58 are formed without seams or voids. As such, the fifth insulation layer 64 does not extend into the first insulation layer 56 and the second insulation layer 58, which reduces device defects and improves device performance.

The first insulation material 66 is formed on the fifth insulation layer 64. The first insulation material 66 may fill remaining portions of the trenches between and adjacent the fin groups G1 and G2. The first insulation material 66 may form the bulk of the lower portions of insulating fins 67 (see FIG. 8) to insulate subsequently formed source/drain regions (see FIGS. 15A through 15D) from each other. The first insulation material 66 may be formed by an acceptable deposition process such as ALD, CVD, FCVD, PVD, or the like. The first insulation material 66 may be formed of one or more dielectric material(s) having a high etch selectivity from the etching of the fourth insulation layer 62 and the fifth insulation layer 64. The first insulation material 66 may be formed of a low-k dielectric material (e.g., a dielectric material having a k-value less than about 3.5). In some embodiments, the first insulation material 66 may be an oxide, such as silicon oxide, silicon oxynitride, silicon oxycarbonitride, silicon oxycarbide, the like, or combinations thereof.

Upper portions of the first insulation material 66 may be removed using one or more acceptable planarization and/or etching processes. The etching processes may be selective to the first insulation material 66 (e.g., the etching processes may selectively etch the first insulation material 66 at a faster rate than the fifth insulation layer 64). After etching, top surfaces of the first insulation material 66 may be below top surfaces of the fins 55. In some embodiments, the first insulation material 66, the fifth insulation layer 64, and/or the fourth insulation layer 62 may be recessed below top surfaces of the fins 55.

The second insulation material 68 is formed on the first insulation material 66. The second insulation material 68 is may fill portions of the trenches between and adjacent the fin groups G1 and G2 that are unfilled by removing the upper portions of the first insulation material 66. The second insulation material 68 may be formed by an acceptable deposition process such as ALD, CVD, PVD, or the like. The second insulation material 68 may be formed of one or more dielectric material(s) having a high etch selectivity from the etching of the fins 55, the first insulation layer 56, the second insulation layer 58, and the third insulation layer 60. For example, the second insulation material 68 may comprise a high-k material such as hafnium oxide, zirconium oxide, zirconium aluminum oxide, hafnium aluminum oxide, hafnium silicon oxide, aluminum oxide, the like, or combinations thereof. In some embodiments, the second insulation material 68 may include as silicon nitride, silicon carbonitride, silicon oxycarbonitride, or the like. The second insulation material 68 may serve as a hard mask that protects the underlying first insulation material 66 from subsequent etching processes.

The second insulation material 68 may be deposited covering the fifth insulation layer 64. Subsequently, a removal process is applied to remove excess material(s) of the second insulation material 68. In some embodiments, a planarization process such as a CMP, an etch-back process, combinations thereof, or the like may be utilized. The planarization process exposes the fifth insulation layer 64 such that top surfaces of the second insulation material 68 and the fifth insulation layer 64 are coplanar (within process variations).

Figure 8:
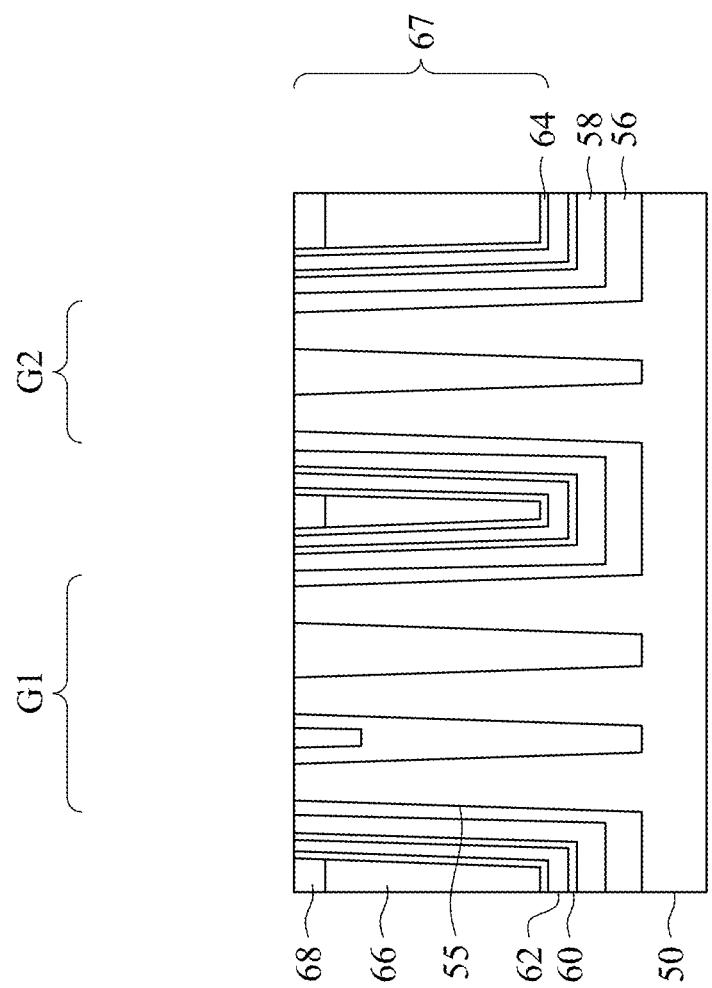

In FIG. 8, a removal process is applied to the second insulation material 68, the fifth insulation layer 64, the fourth insulation layer 62, the third insulation layer 60, the second insulation layer 58, the first insulation layer 56, the second mask layer 54, the first mask layer 52, and the fins 55. The removal process may be used to remove excess insulation material over the fins 55. In some embodiments, a planarization process such as a chemical mechanical polish (CMP), an etch-back process, combinations thereof, or the like may be utilized. The planarization process may planarize the second insulation material 68, the fifth insulation layer 64, the fourth insulation layer 62, the third insulation layer 60, the second insulation layer 58, the first insulation layer 56, and the fins 55 and remove the second mask layer 54 and the first mask layer 52. The planarization process exposes the fins 55 such that top surfaces of the fins 55, the second insulation material 68, the fifth insulation layer 64, the fourth insulation layer 62, the third insulation layer 60, the second insulation layer 58, and the first insulation layer 56 are level after the planarization process is complete.

The removal process forms insulating fins 67 (also referred to as hybrid fins or dielectric fins) between and adjacent the fin groups G1 and G2. The insulating fins 67 comprise the second insulation material 68, the first insulation material 66, the fifth insulation layer 64, and the fourth insulation layer 62. Forming the first insulation layer 56 and the second insulation layer 58 according to the above-described methods ensures that the thickness of the first insulation layer 56 and the second insulation layer 58 below the insulating fins 67 is minimized, which allows the insulating fins 67 to be formed with larger volumes. This improves insulation between the fins groups G1 and G2.

Figure 9:
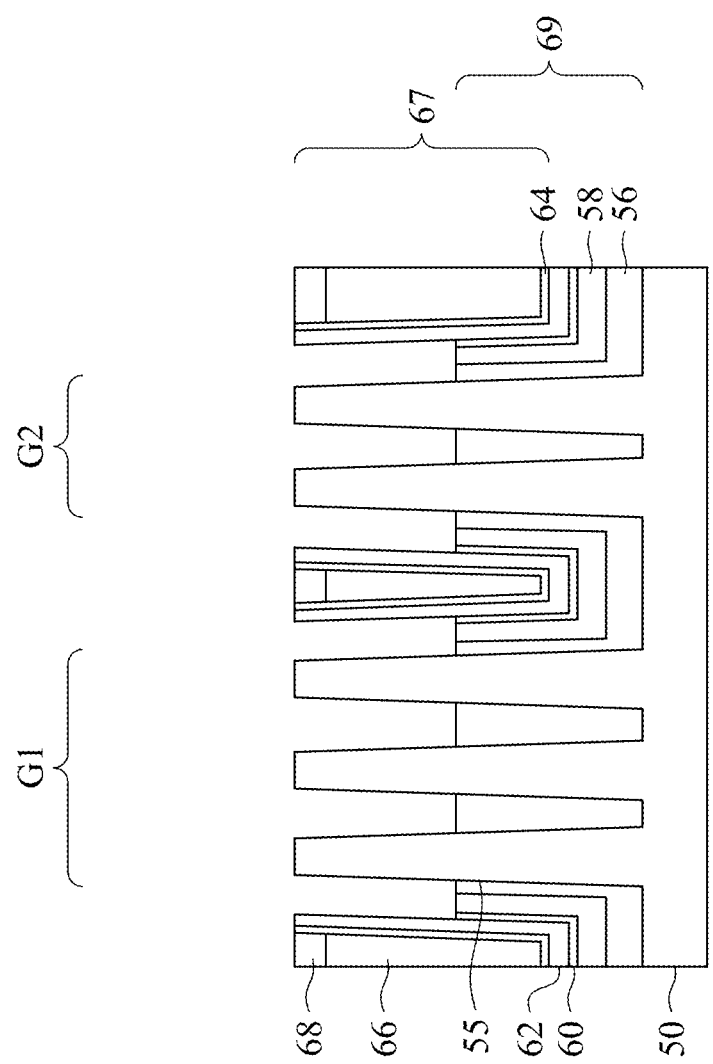

In FIG. 9, the third insulation layer 60, the second insulation layer 58, and the first insulation layer 56 are recessed to form shallow trench isolation (STI) regions 69. The third insulation layer 60, the second insulation layer 58, and the first insulation layer 56 are recessed such that upper portions of the fins 55 and the insulating fins 67 protrude from between neighboring STI regions 69. The top surfaces of the STI regions 69 may have flat surfaces as illustrated, convex surfaces, concave surfaces (such as dishing), or a combination thereof. The top surfaces of the STI regions 69 may be formed flat, convex, and/or concave by an appropriate etch. The STI regions 69 may be recessed using an acceptable etching process, such as one that is selective to the material of the third insulation layer 60, the second insulation layer 58, and the first insulation layer 56 (e.g., etches the material of the third insulation layer 60, the second insulation layer 58, and the first insulation layer 56 at a faster rate than the material of the fins 55, the second insulation material 68, the fifth insulation layer 64, and the fourth insulation layer 62). For example, an oxide removal using, for example, dilute hydrofluoric (dHF) acid may be used. Forming the first insulation layer 56 and the second insulation layer 58 according to the above-described methods ensures that the STI regions 69 are formed without voids or seams and without undesired materials, such as portions of the fifth insulation layer 64, formed therein. This improves insulation provided by the STI regions 69, reduces device defects, and improves device performance.

The process described with respect to FIGS. 3 through 9 is just one example of how the fins 55 may be formed. In some embodiments, the fins 55 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 55. For example, the fins 55 in FIG. 9 can be recessed, and a material different from the fins 55 may be epitaxially grown over the recessed fins 55. In such embodiments, the fins 55 comprise the recessed material as well as the epitaxially grown material disposed over the recessed material. In some embodiments, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 55. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in the n-type region (e.g., an NMOS region) different from the material in p-type region (e.g., a PMOS region). In some embodiments, upper portions of the fins 55 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 9, appropriate wells (not separately illustrated) may be formed in the fins 55 and/or the substrate 50. In some embodiments, a P well may be formed in the n-type region, and an N well may be formed in the p-type region. In some embodiments, a P well or an N well are formed in both the n-type region and the p-type region.

In the embodiments with different well types, the different implant steps for the n-type region and the p-type region may be achieved using a photoresist or other masks (not separately illustrated). For example, a photoresist may be formed over the fins 55 and the STI regions 69 in the n-type region. The photoresist is patterned to expose the p-type region of the substrate 50, such as a PMOS region. The photoresist can be formed by using a spin-on technique and can be patterned using acceptable photolithography techniques. Once the photoresist is patterned, an n-type impurity implant is performed in the p-type region, and the photoresist may act as a mask to prevent n-type impurities from being implanted into the n-type region, such as an NMOS region. The n-type impurities may be phosphorus, arsenic, antimony, or the like implanted in the region to a concentration of equal to or less than $1\times10^{18}$ atoms/cm$^3$, such as between about $1\times10^{16}$ atoms/cm$^3$ and about $1\times10^{18}$ atoms/cm$^3$. After the implant, the photoresist is removed, such as by an acceptable ashing process.

Following the implanting of the p-type region, a photoresist is formed over the fins 55 and the STI regions 69 in the p-type region. The photoresist is patterned to expose the n-type region of the substrate 50, such as the NMOS region. The photoresist can be formed by using a spin-on technique and can be patterned using acceptable photolithography techniques. Once the photoresist is patterned, a p-type impurity implant may be performed in the n-type region, and the photoresist may act as a mask to prevent p-type impurities from being implanted into the p-type region, such as the PMOS region. The p-type impurities may be boron, boron fluoride, indium, or the like implanted in the region to a concentration of equal to or less than $1\times10^{18}$ atoms/cm$^3$, such as between about $1\times10^{16}$ atoms/cm$^3$ and about $1\times10^{18}$ atoms/cm$^3$. After the implant, the photoresist may be removed, such as by an acceptable ashing process.

After the implants of the n-type region and the p-type region, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 10:
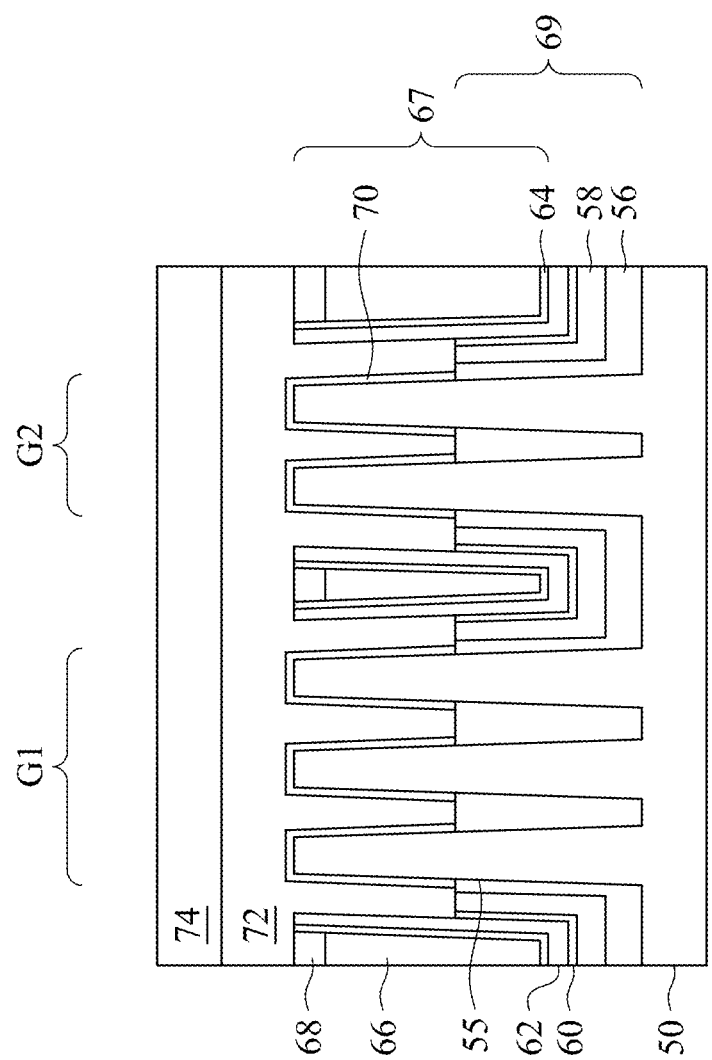

In FIG. 10, dummy dielectric layers 70 are formed on the fins 55 and the substrate 50. The dummy dielectric layers 70 may be, for example, silicon oxide, silicon nitride, a combination thereof, or the like, and may be deposited or thermally grown according to acceptable techniques. A dummy gate layer 72 is formed over the dummy dielectric layers 70, and a mask layer 74 is formed over the dummy gate layer 72. The dummy gate layer 72 may be deposited over the dummy dielectric layers 70 and then planarized by a process such as CMP. The mask layer 74 may be deposited over the dummy gate layer 72. The dummy gate layer 72 may be conductive or non-conductive materials and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques known and used in the art for depositing the selected material. The dummy gate layer 72 may be made of other materials that have a high etching selectivity from the material of the STI regions 69. The mask layer 74 may include, for example, silicon nitride, silicon oxynitride, or the like. In this example, a single dummy gate layer 72 and a single mask layer 74 are formed. It is noted that the dummy dielectric layers 70 are shown covering only the fins 55 and the substrate 50 for illustrative purposes only. In some embodiments, the dummy dielectric layers 70 may be deposited such that the dummy dielectric layers 70 cover the STI regions 69, extending between the dummy gate layer 72 and the STI regions 69.

Figures 11A, 11B:
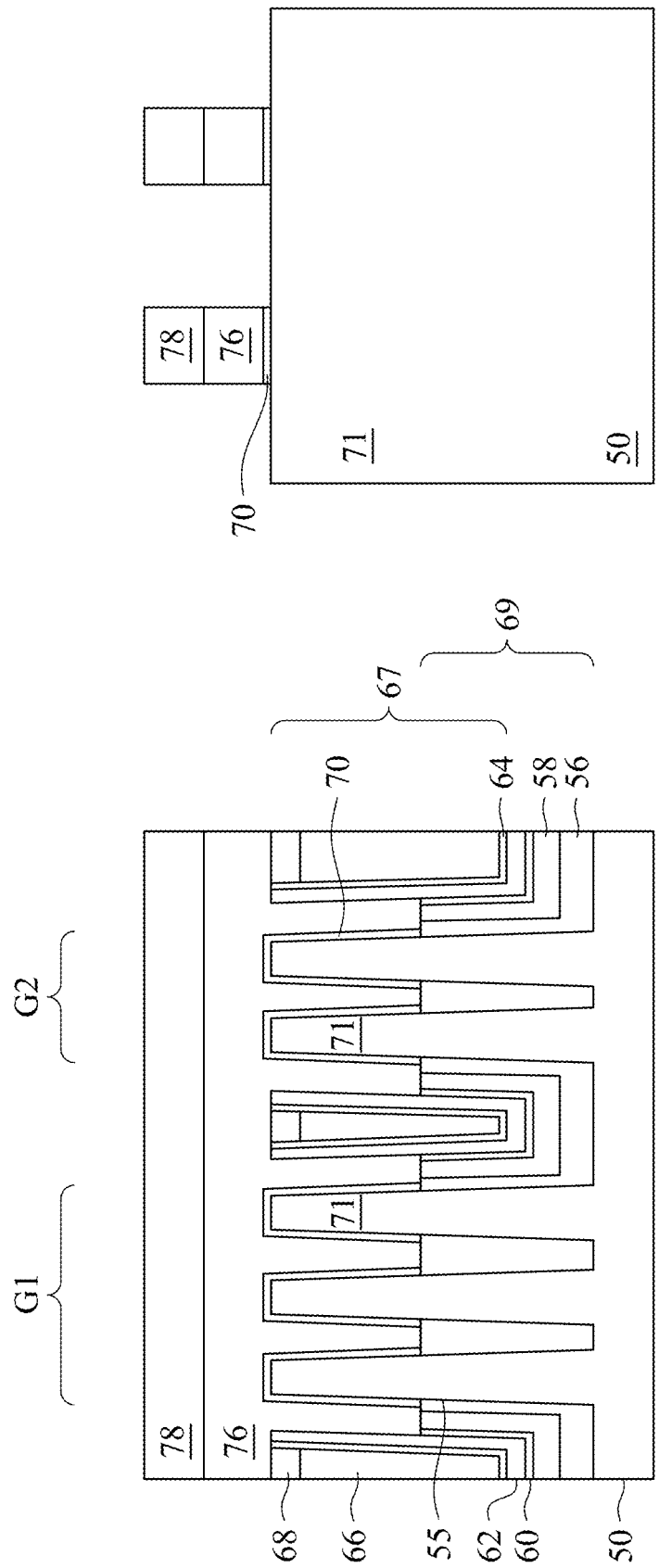

In FIGS. 11A and 11B, the mask layer 74 (see FIG. 10) may be patterned using acceptable photolithography and etching techniques to form masks 78. An acceptable etching technique may be used to transfer the pattern of the masks 78 to the dummy gate layer 72 to form dummy gates 76. In some embodiments, the pattern of the masks 78 may also be transferred to the dummy dielectric layers 70. The dummy gates 76 cover respective channel regions 71 of the fins 55. The pattern of the masks 78 may be used to physically separate each of the dummy gates 76 from adjacent dummy gates 76. The dummy gates 76 may also have a lengthwise direction substantially perpendicular to the lengthwise direction of respective fins 55. The dummy dielectric layers 70, the dummy gates 76, and the masks 78 may be collectively referred to as "dummy gate stacks."

Figures 12A, 12B:
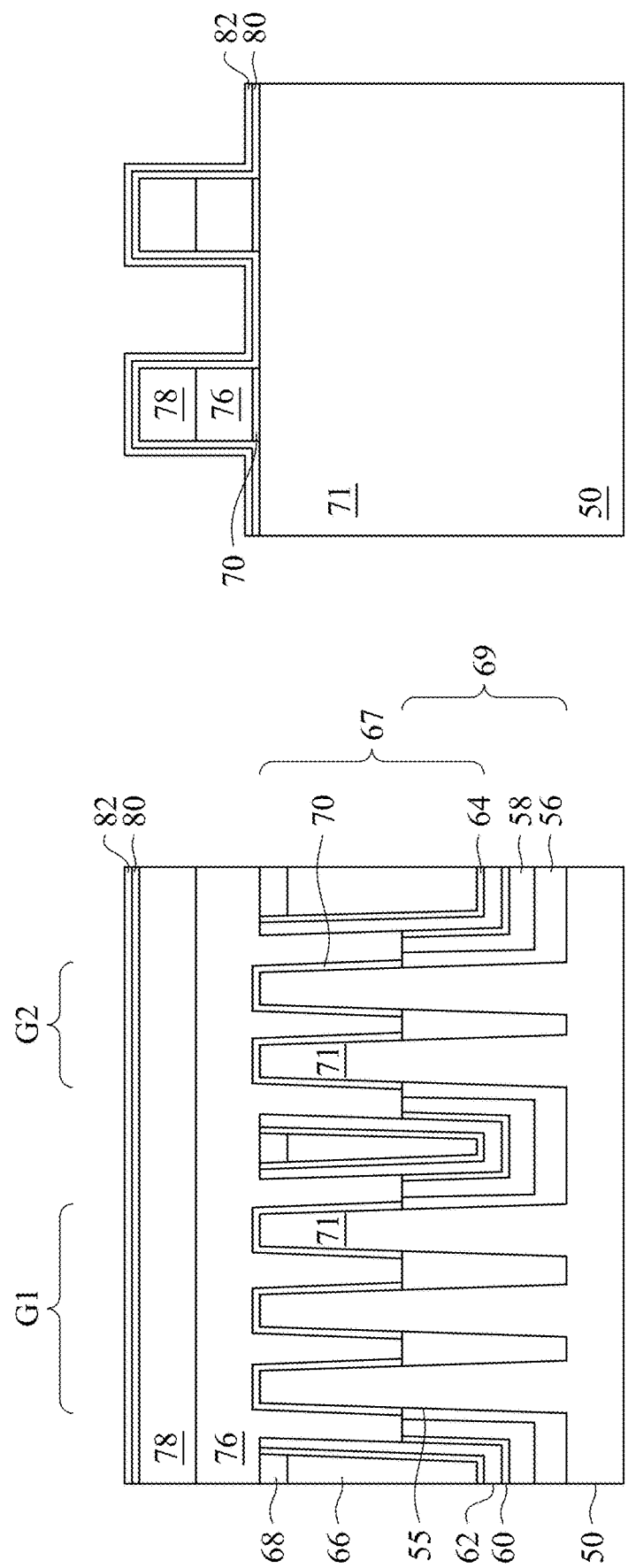
Figure 12C:
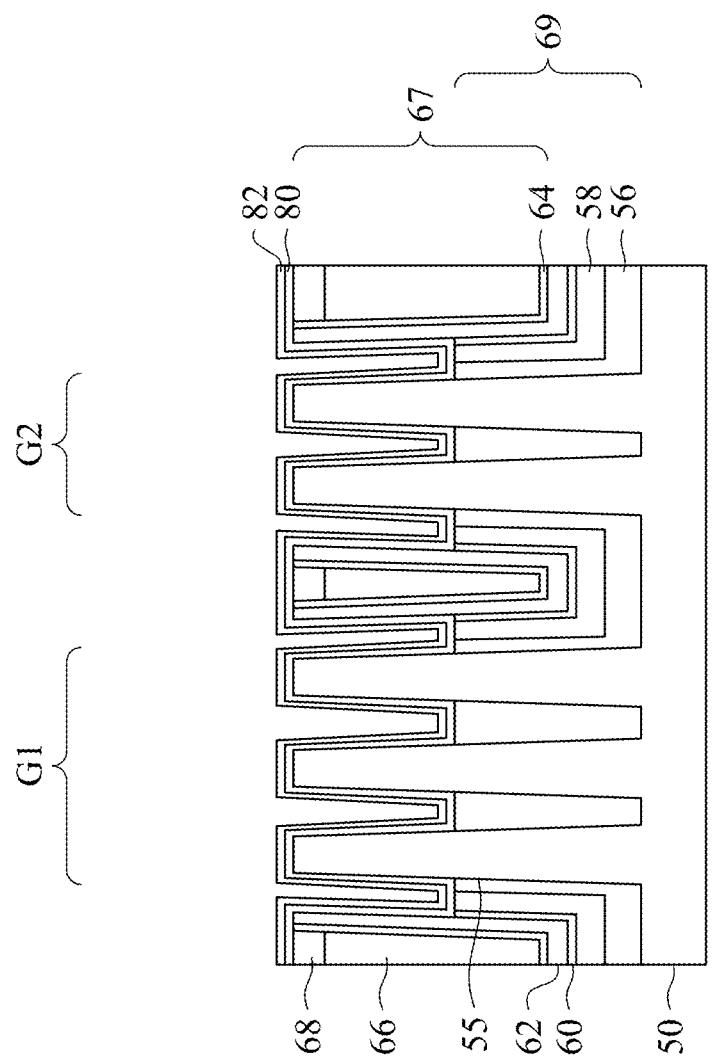

In FIGS. 12A through 12C, a first spacer layer 80 and a second spacer layer 82 are formed over the structures illustrated in FIGS. 11A and 11B. In FIGS. 12A through 12C, the first spacer layer 80 is formed on top surfaces of the STI regions 69, top surfaces and sidewalls of the fins 55 and the masks 78, and sidewalls of the dummy gates 76 and the dummy dielectric layers 70. The second spacer layer 82 is deposited over the first spacer layer 80. The first spacer layer 80 may be formed by thermal oxidation or deposited by CVD, ALD, or the like. The first spacer layer 80 may be formed of silicon oxide, silicon nitride, silicon oxynitride, or the like. The second spacer layer 82 may be deposited by CVD, ALD, or the like. The second spacer layer 82 may be formed of silicon oxide, silicon nitride, silicon oxynitride, or the like.

Figure 13B:
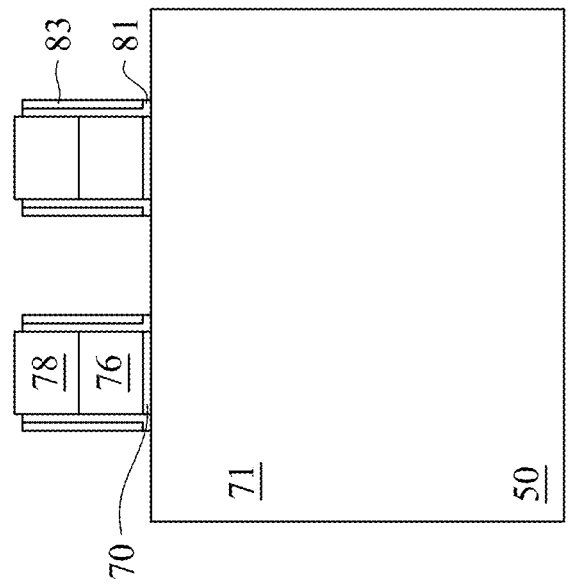
Figure 13A:
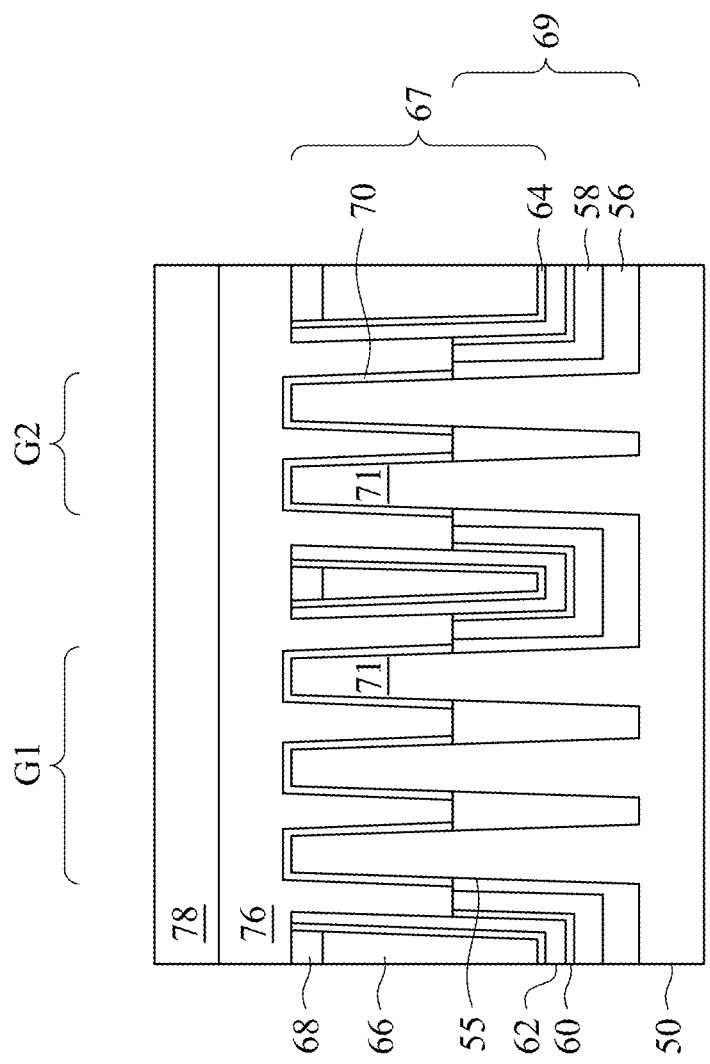
Figure 13C:
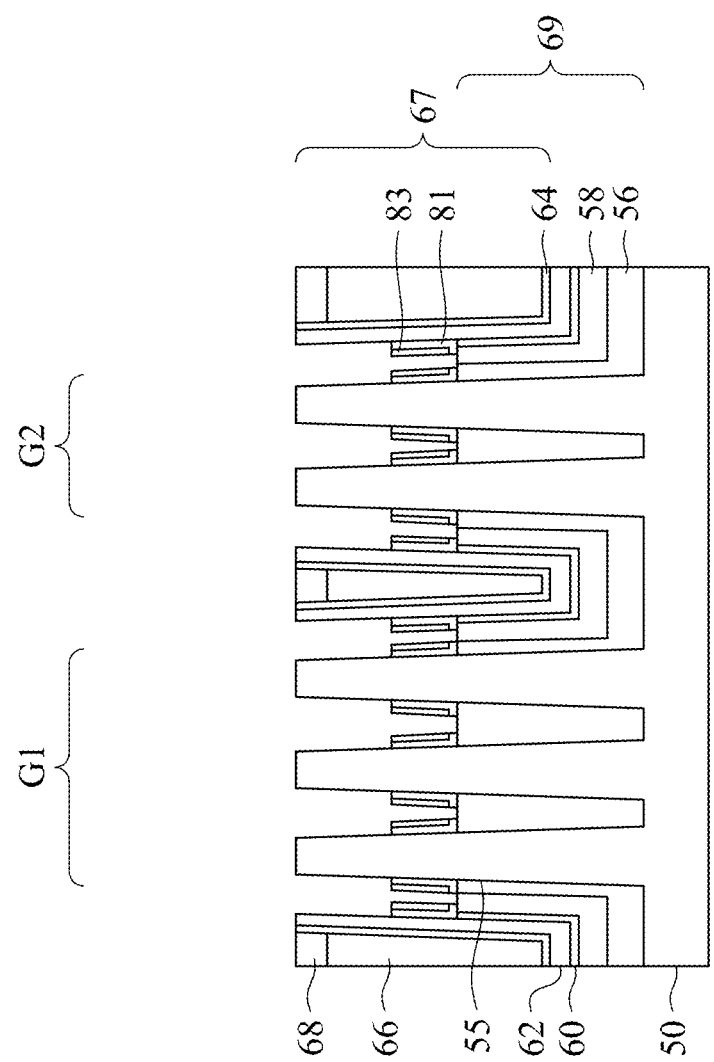

In FIGS. 13A through 13C, the first spacer layer 80 and the second spacer layer 82 are etched to form first spacers 81 and second spacers 83. The first spacer layer 80 and the second spacer layer 82 may be etched using a suitable etching process, such as an anisotropic etching process (e.g., a dry etching process) or the like. The first spacers 81 and the second spacers 83 may be disposed on sidewalls of the fins 55, the dummy dielectric layers 70, the dummy gates 76, and the masks 78. The first spacers 81 and the second spacers 83 may have different heights adjacent the fins 55 and the dummy gate stacks due to the etching processes used to etch the first spacer layer 80 and the second spacer layer 82, as well as different heights between the fins 55 and the dummy gate stacks. Specifically, as illustrated in FIGS. 13B and 13C, in some embodiments, the first spacers 81 and the second spacers 83 may extend partially up sidewalls of the fins 55 and the dummy gate stacks. In some embodiments, the first spacers 81 and the second spacers 83 may extend to top surfaces of the dummy gate stacks.

After the first spacers 81 and the second spacers 83 are formed, implants for lightly doped source/drain (LDD) regions (not separately illustrated) may be performed. In embodiments with different device types, similar to the implants discussed above in FIG. 9, a mask, such as a photoresist, may be formed over the n-type region, while exposing the p-type region, and appropriate type (e.g., p-type) impurities may be implanted into the exposed fins 55 and the substrate 50 in the p-type region. The mask may then be removed. Subsequently, a mask, such as a photoresist, may be formed over the p-type region while exposing the n-type region, and appropriate type impurities (e.g., n-type) may be implanted into the exposed fins 55 and the substrate 50 in the n-type region. The mask may then be removed. The n-type impurities may be the any of the n-type impurities previously discussed, and the p-type impurities may be the any of the p-type impurities previously discussed. The lightly doped source/drain regions may have a concentration of impurities of from about $1 \times 10^{15}$ atoms/cm$^3$ to about $1 \times 10^{19}$ atoms/cm$^3$. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized (e.g., the first spacers 81 may be formed prior to forming the second spacers 83, additional spacers may be formed and removed, and/or the like). Furthermore, the n-type and p-type devices may be formed using a different structures and steps.

Figures 14A, 14B:
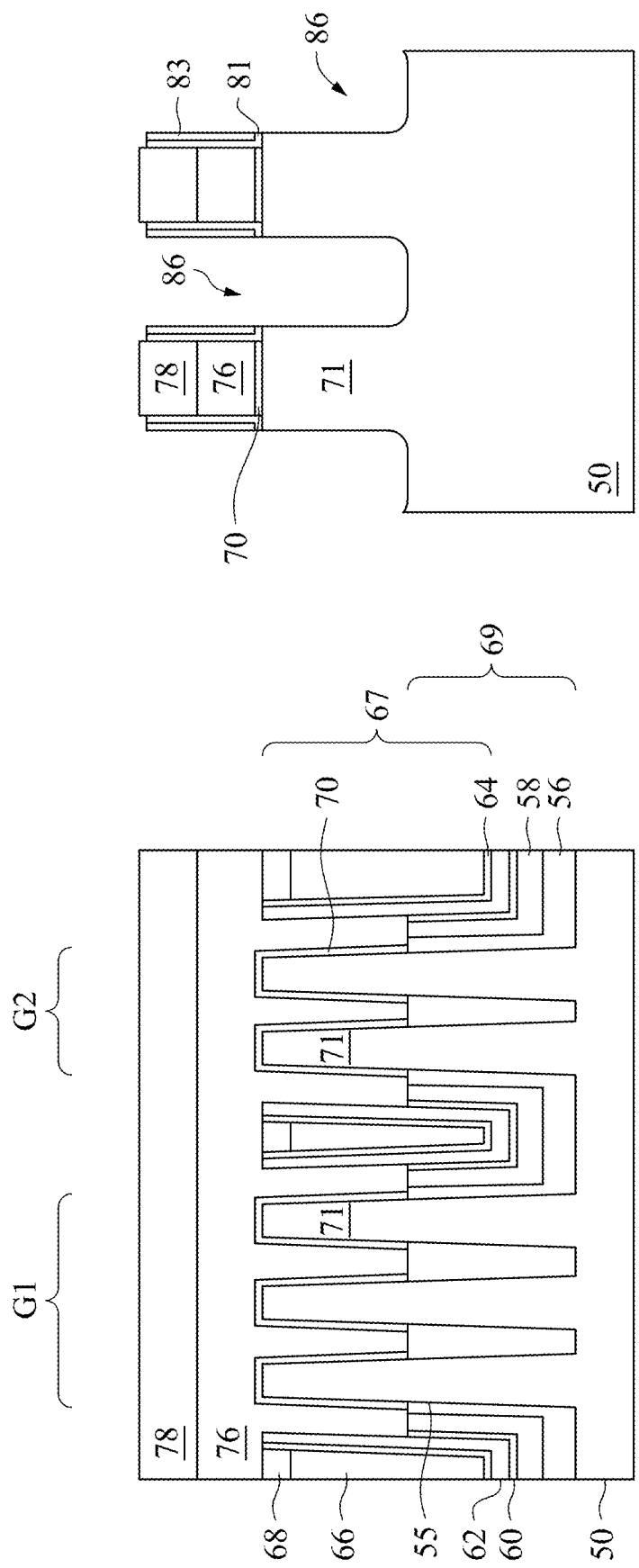
Figure 14C:
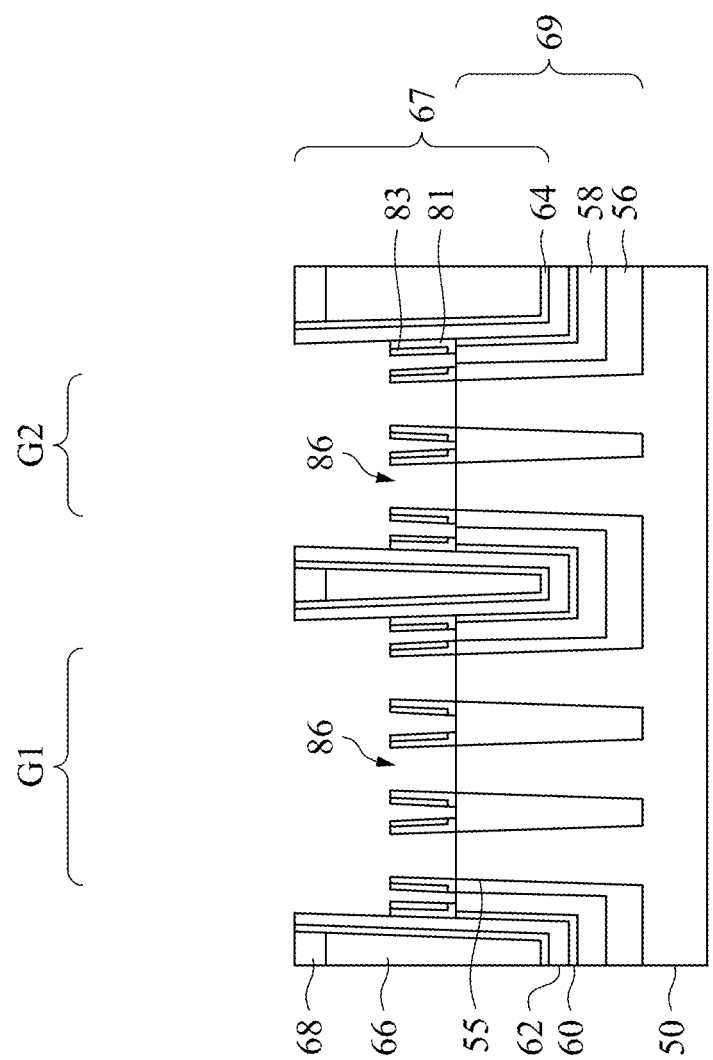

In FIGS. 14A through 14C, the substrate 50 and the fins 55 are etched to form recesses 86. As illustrated in FIG. 14C, top surfaces of the STI regions 69 may be level with top surfaces of the fins 55. In some embodiments, bottom surfaces of the recesses 86 are disposed above or below the top surfaces of the STI regions 69. The fins 55 and the substrate 50 are etched using anisotropic etching processes, such as RIE, NBE, or the like. The first spacers 81, the second spacers 83, and the masks 78 mask portions of the fins 55 and the substrate 50 during the etching processes used to form the recesses 86. A single etch process or multiple etch processes may be used to form the recesses 86. Timed etch processes may be used to stop the etching of the recesses 86 after the recesses 86 reach a desired depth.

Figures 15A, 15B:
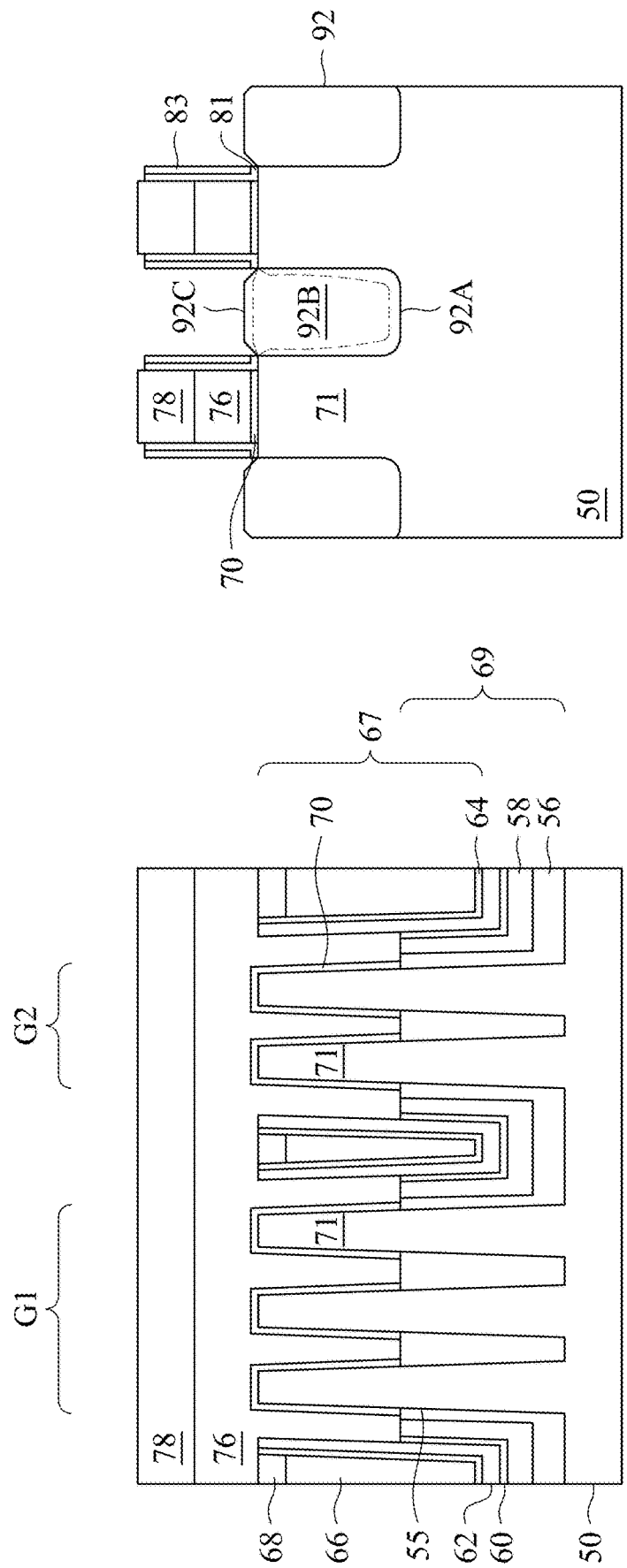

In FIGS. 15A through 15D, epitaxial source/drain regions 92 (e.g., source regions and/or drain regions) are formed in the recesses 86 (see FIGS. 14A through 14C) to exert stress on the channel regions 71 of the fins 55, thereby improving performance. As illustrated in FIG. 15B, the epitaxial source/drain regions 92 are formed in the recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 by an appropriate lateral distance so that the epitaxial source/drain regions 92 do not short out subsequently formed gates of the resulting FinFETs.

The epitaxial source/drain regions 92 in the n-type region, e.g., the NMOS region, may be formed by masking the p-type region, e.g., the PMOS region. Then, the epitaxial source/drain regions 92 are epitaxially grown in the recesses 86. The epitaxial source/drain regions 92 may include any acceptable material, such as appropriate for n-type FinFETs. For example, if the fins 55 are silicon, the epitaxial source/drain regions 92 may include materials exerting a tensile strain on the fins 55, such as silicon, silicon carbide, phosphorous-doped silicon carbide, silicon phosphide, or the like. The epitaxial source/drain regions 92 may have surfaces raised from respective surfaces of the fins 55 and may have facets.

The epitaxial source/drain regions 92 in the p-type region, e.g., the PMOS region, may be formed by masking the n-type region, e.g., the NMOS region. Then, the epitaxial source/drain regions 92 are epitaxially grown in the recesses 86. The epitaxial source/drain regions 92 may include any acceptable material, such as appropriate for p-type NSFETs. For example, if the fins 55 are silicon, the epitaxial source/drain regions 92 may comprise materials exerting a compressive strain on the fins 55, such as silicon-germanium, boron doped silicon-germanium, germanium, germanium tin, or the like. The epitaxial source/drain regions 92 may also have surfaces raised from respective surfaces of the fins 55 and may have facets.

The epitaxial source/drain regions 92, the fins 55, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

Figure 15C:
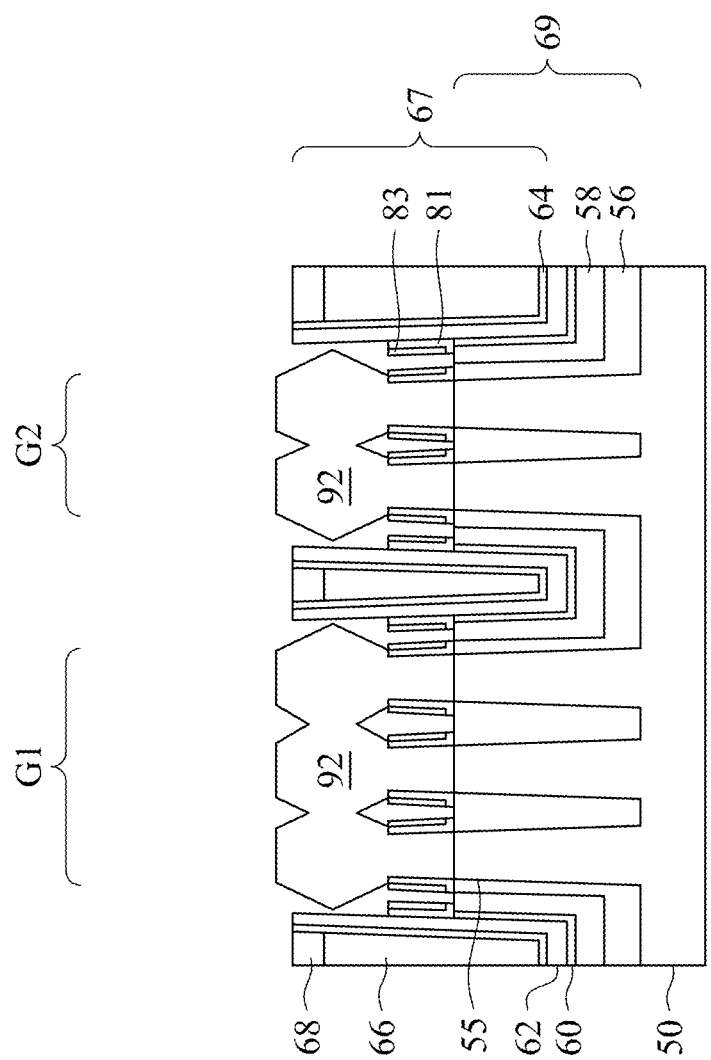
Figure 15D:
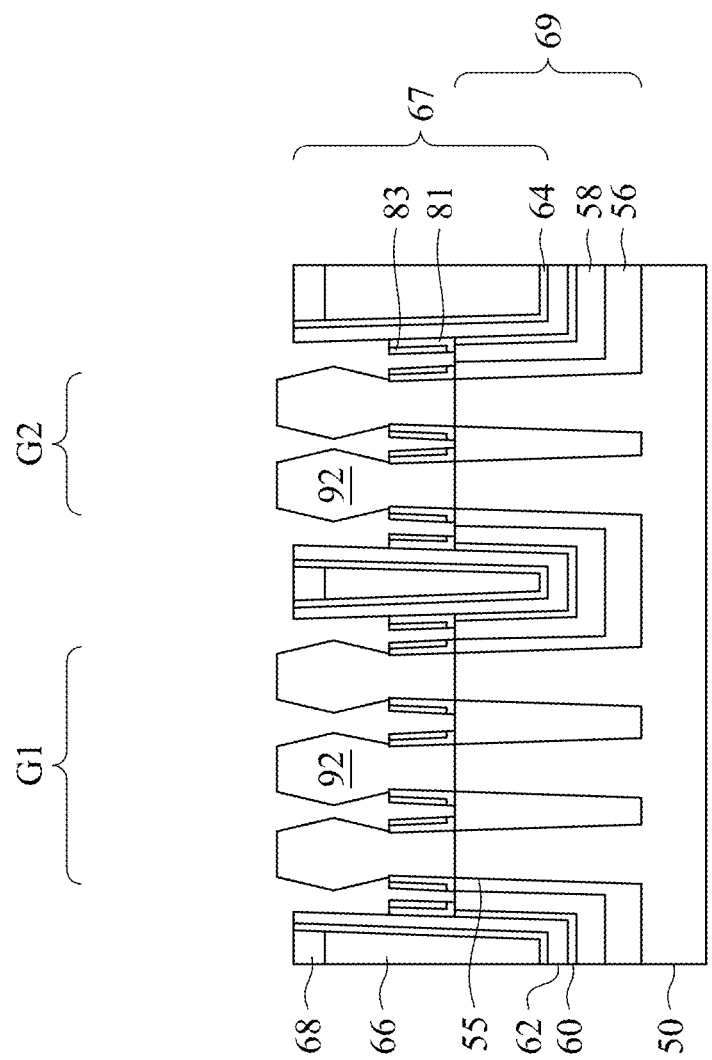

The epitaxy processes used to form the epitaxial source/drain regions 92 in the n-type region and the p-type region form the epitaxial source/drain regions 92 with upper surfaces that have facets, which expand laterally outward beyond sidewalls of the fins 55. In some embodiments, these facets cause adjacent epitaxial source/drain regions 92 of a same FinFET (e.g., in a same fin group G1/G2) to merge as illustrated by FIG. 15C. In some embodiments, adjacent epitaxial source/drain regions 92 remain separated after the epitaxy process is completed as illustrated by FIG. 15D. In the embodiments illustrated in FIGS. 15C and 15D, the first spacers 81 may be formed covering portions of the sidewalls of the fins 55 that extend above the STI regions 69 thereby blocking the epitaxial growth. In some embodiments, the spacer etch used to form the first spacers 81 may be adjusted to remove the spacer material to allow the epitaxially grown region to extend to the surface of the STI region 69. Moreover, the insulating fins 67 separate and provide insulation between the epitaxial source/drain regions 92 formed over each of the fin groups G1 and G2.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and/or may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 16B:
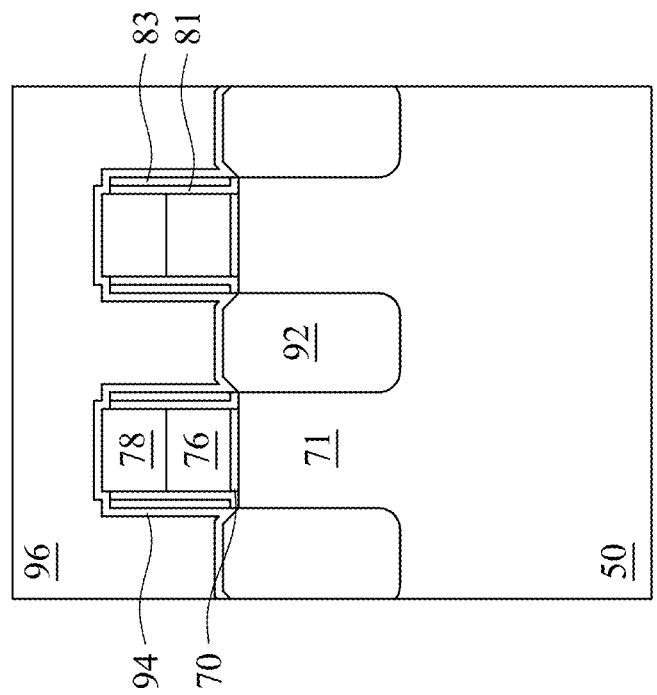
Figure 16A:
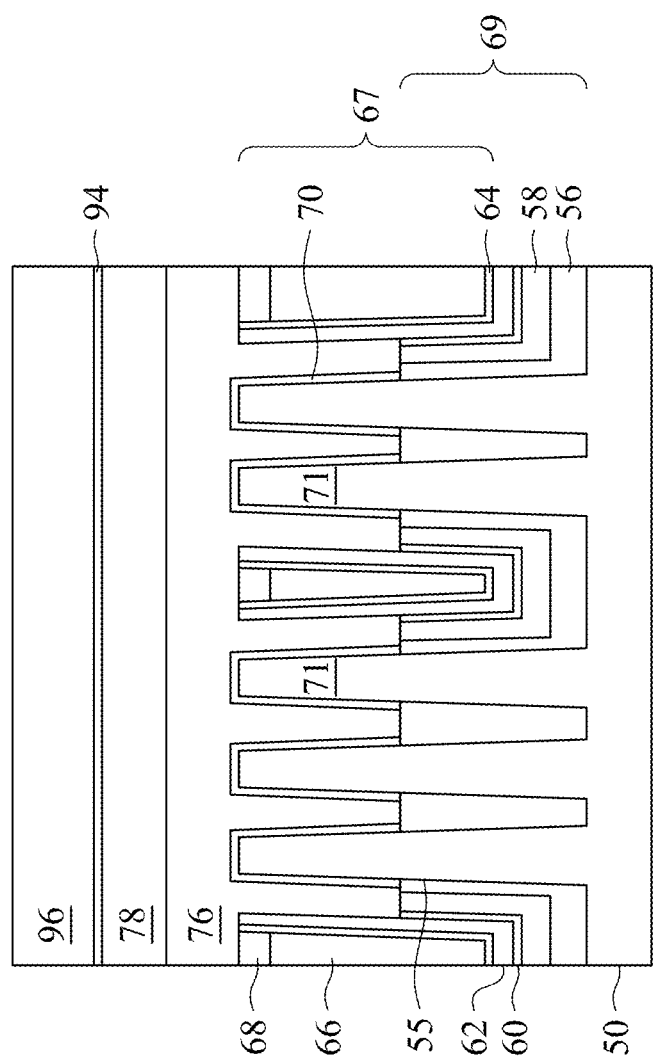

In FIGS. 16A and 16B, a first interlayer dielectric (ILD) 96 is deposited over the structure illustrated in FIGS. 15A and 15B, respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. In some embodiments, the dielectric materials for the first ILD 96 may include silicon oxide, silicon nitride, silicon oxynitride, or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96. In some embodiments, the first ILD 96 may be formed of silicon oxide or silicon nitride and the CESL 94 may be formed of silicon oxide or silicon nitride.

Figure 17B:
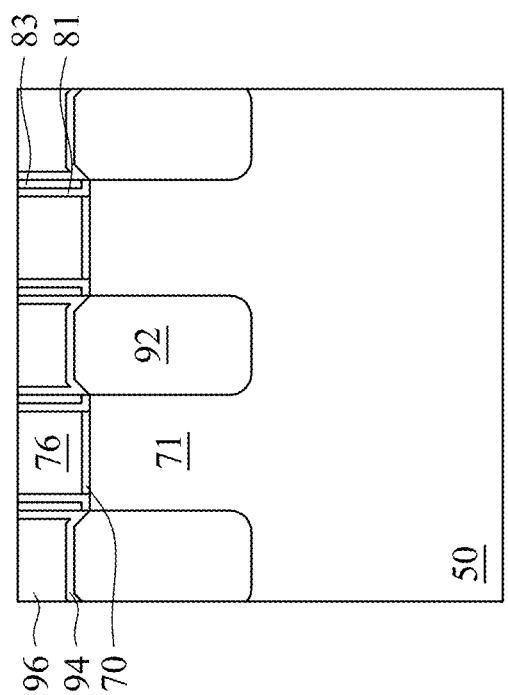
Figure 17A:
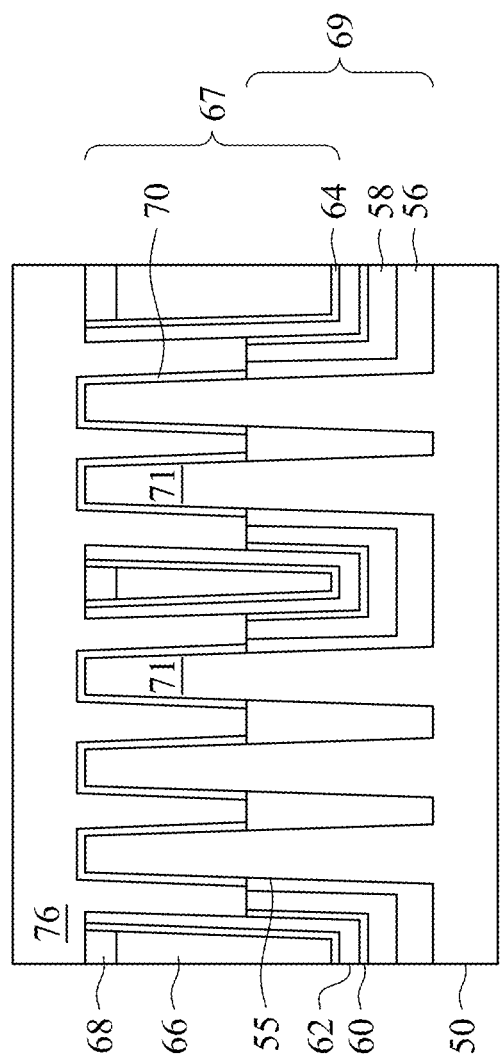

In FIGS. 17A and 17B, a planarization process, such as a CMP, may be performed to level top surfaces of the first ILD 96 and the CESL 94 with top surfaces of the dummy gates 76, the first spacers 81, and the second spacers 83. The planarization process may also remove the masks 78 on the dummy gates 76, and portions of the first spacers 81 along sidewalls of the masks 78. After the planarization process, top surfaces of the dummy gates 76, the first spacers 81, the second spacers 83, the CESL 94, and the first ILD 96 are level. Accordingly, the top surfaces of the dummy gates 76 are exposed through the first ILD 96. In some embodiments, the masks 78 may remain, in which case the planarization process levels top surfaces of the first ILD 96 and the CESL 94 with top surfaces of the masks 78, the first spacers 81, and the second spacers 83.

Figures 18A, 18B:
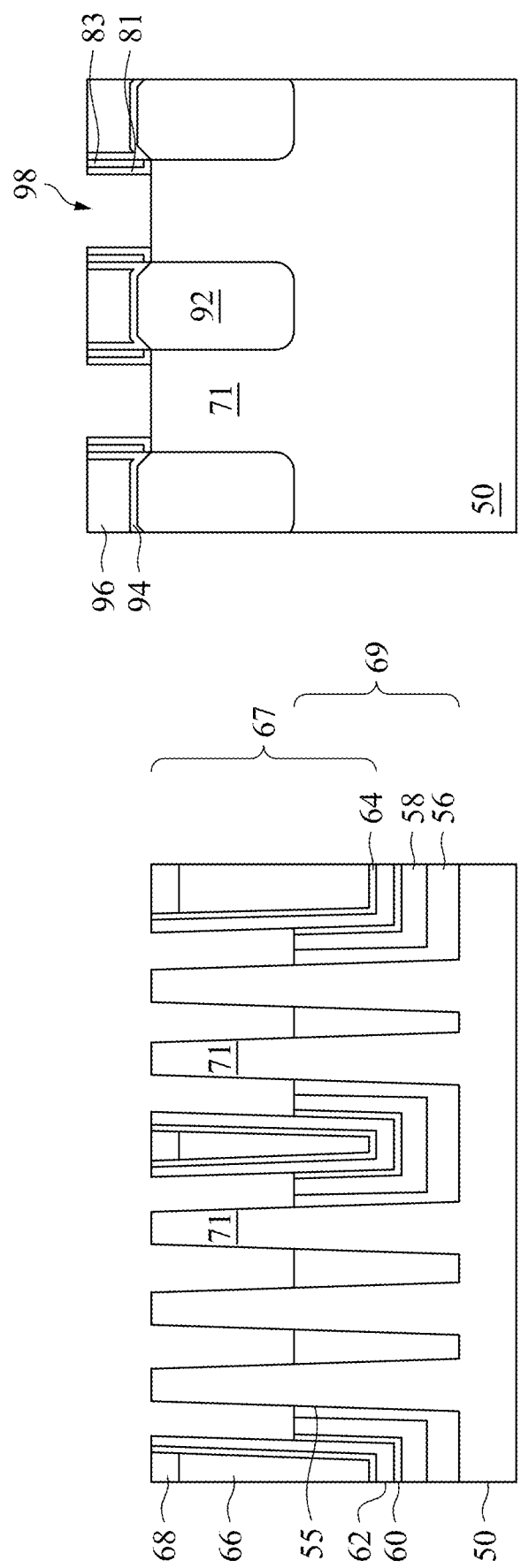

In FIGS. 18A and 18B, the dummy gates 76, and the masks 78 if present, are removed in an etching step(s) forming recesses 98. Portions of the dummy dielectric layers 70 below the dummy gates 76 may also be removed. In some embodiments, only the dummy gates 76 are removed, the dummy dielectric layers 70 remain, and the dummy dielectric layers 70 are exposed by the recesses 98. In some embodiments, the dummy dielectric layers 70 are removed from below the dummy gates 76 in a first region of a die (e.g., a core logic region) and remain below the dummy gates 76 in a second region of the die (e.g., an input/output region). In some embodiments, the dummy gates 76 are removed by an anisotropic dry etch process. For example, the etching process may include a dry etch process using reaction gas(es) that selectively etch the dummy gates 76 at a faster rate than the first ILD 96, the CESL 94, the first spacers 81, and the second spacers 83. Each of the recesses 98 exposes and/or overlies a channel region 71 of a respective fin 55. Each channel region 71 is disposed between neighboring pairs of the epitaxial source/drain regions 92. During the removal, the dummy dielectric layers 70 may be used as etch stop layers when the dummy gates 76 are etched. The dummy dielectric layers 70 may be optionally removed after removing the dummy gates 76.

Figure 19B:
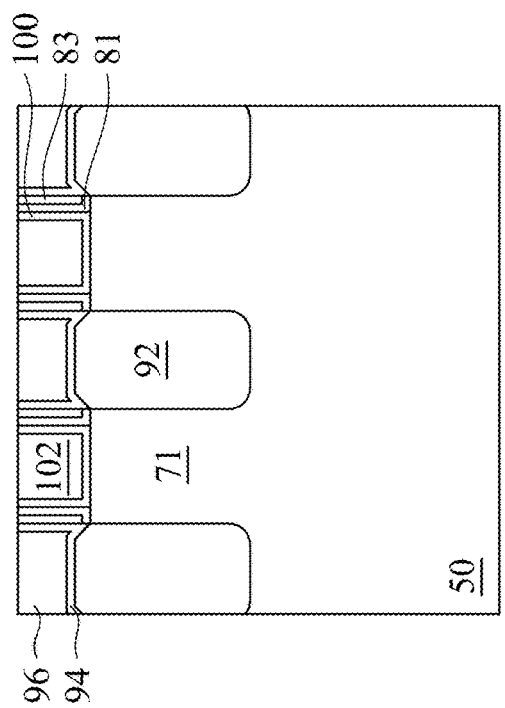
Figure 19A:
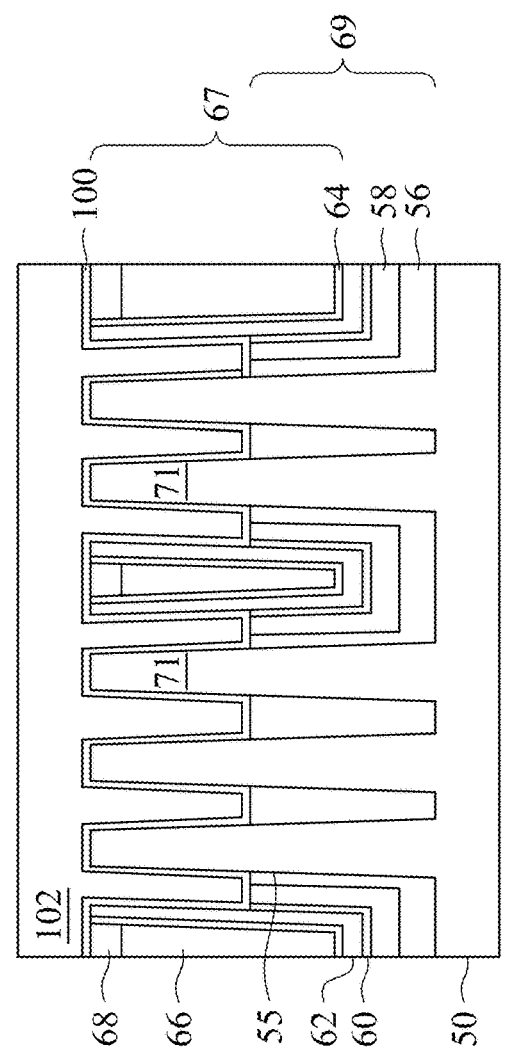

In FIGS. 19A and 19B, gate dielectric layers 100 and gate electrodes 102 are formed for replacement gates. The gate dielectric layers 100 may be formed by depositing one or more layers in the recesses 98, such as on top surfaces and side surfaces of the fins 55, the first spacers 81, and the insulating fins 67; and on top surfaces of the STI regions 69, the first ILD 96, the CESL 94, and the second spacers 83.

The gate dielectric layers 100 may comprise one or more layers of silicon oxide, silicon nitride, metal oxides, metal silicates, or the like. For example, in some embodiments, the gate dielectric layers 100 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, a combination thereof, or the like. The gate dielectric layers 100 may include a dielectric layer having a k-value greater than about 7.0. The gate dielectric layers 100 may be deposited by molecular-beam deposition (MBD), ALD, PECVD, or the like. In embodiments where portions of the dummy dielectric layers 70 remain on the fins 55, the gate dielectric layers 100 may include a material of the dummy dielectric layers 70 (e.g., $SiO_2$).

The gate electrodes 102 are deposited on the gate dielectric layers 100 and fill remaining portions of the recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 102 is illustrated in FIG. 19B, the gate electrodes 102 may comprise any number of liner layers, any number of work function tuning layers, and a fill material. After the filling of the recesses 98, a planarization process, such as a CMP, is performed to remove excess portions of the gate dielectric layers 100 and the gate electrodes 102, which excess portions are over top surfaces of the first ILD 96, the CESL 94, the first spacers 81, and the second spacers 83. The remaining portions of the gate electrodes 102 and the gate dielectric layers 100 form replacement gates of the resulting FinFETs. The gate electrodes 102 and the gate dielectric layers 100 may be collectively referred to as "gate stacks." The gate stacks may extend along top surfaces and side surfaces of the channel regions 71 of the fins 55.

The formation of the gate dielectric layers 100 in the n-type region and the p-type region may occur simultaneously such that the gate dielectric layers 100 in each region are formed from the same materials. The formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials. The gate electrodes 102 in each region may be formed by distinct processes, such that the gate electrodes 102 may be different materials. Various masking steps may be used to mask and expose appropriate regions when using distinct processes.

Figures 20A, 20B:
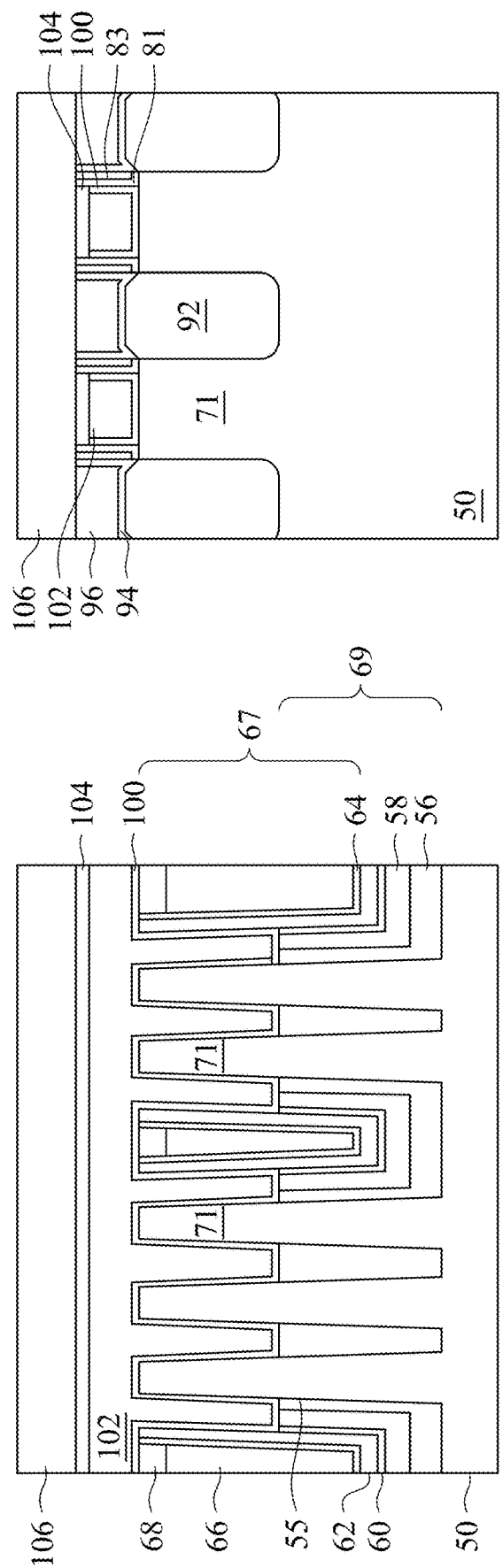

In FIGS. 20A and 20B, a second ILD 106 is deposited over the first ILD 96, the CESL 94, the first spacers 81, the second spacers 83, the gate dielectric layers 100, and the gate electrodes 102. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like. In some embodiments, the dielectric materials for the second ILD 106 may include silicon oxide, silicon nitride, silicon oxynitride, or the like. In some embodiments, before the formation of the second ILD 106, the gate stacks (including the gate dielectric layers 100 and the corresponding overlying gate electrodes 102) are recessed, so that recesses are formed directly over each of the respective gate stacks and between opposing portions of the first spacers 81.

Gate caps 104 comprising one or more layers of dielectric material, such as silicon nitride, silicon oxynitride, or the like, are filled in the recess, followed by a planarization process to remove excess portions of the dielectric material extending over the first ILD 96, the CESL 94, the first spacers 81, and the second spacers 83. Subsequently formed gate contacts (such as the gate contacts 110, discussed below with respect to FIGS. 21A and 21B) penetrate through the gate caps 104 to contact top surfaces of the recessed gate electrodes 102.

Figures 21A, 21B:
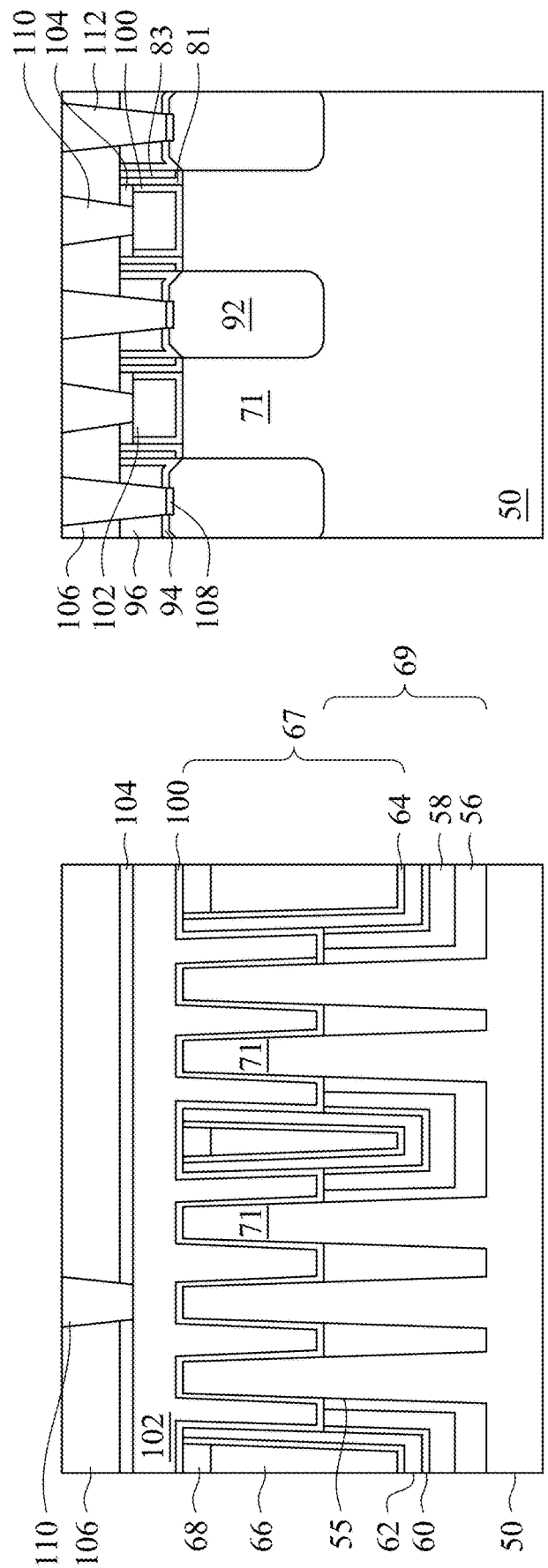

In FIGS. 21A and 21B, gate contacts 110 are formed through the second ILD 106 and the gate caps 104 and source/drain contacts 112 are formed through the second ILD 106, the first ILD 96, and the CESL 94. Openings for the source/drain contacts 112 are formed through the second ILD 106, the first ILD 96, and the CESL 94 and openings for the gate contacts 110 are formed through the second ILD 106 and the gate caps 104. The openings may be formed using acceptable photolithography and etching techniques. In some embodiments, after the openings for the source/drain contacts 112 are formed through the second ILD 106, the first ILD 96, and the CESL 94, silicide regions 108 are formed over the epitaxial source/drain regions 92. The silicide regions 108 may be formed by first depositing a metal (not separately illustrated) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 108.

A liner, such as a diffusion barrier layer, an adhesion layer, or the like, and a conductive material are formed in the openings for the source/drain contacts 112 and the gate contacts 110. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106. The remaining liner and conductive material form the source/drain contacts 112 and the gate contacts 110 in the openings. The source/drain contacts 112 are electrically coupled to the epitaxial source/drain regions 92 through the silicide regions 108 and the gate contacts 110 are electrically coupled to the gate electrodes 102. The source/drain contacts 112 and the gate contacts 110 may be formed in different processes, or may be formed in the same process. Although shown as being formed in the same cross-sections, it should be appreciated that each of the source/drain contacts 112 and the gate contacts 110 may be formed in different cross-sections, which may avoid shorting of the contacts.

Forming the first insulation layer 56 and the second insulation layer 58 by FCVD using the process parameters discussed above ensures that the first insulation layer 56 and the second insulation layer 58 fill gaps between the fins 55 within the fin groups G1 and G2 without seams or voids and that the first insulation layer 56 and the second insulation layer 58 have a minimal thickness between and adjacent to the fin groups G1 and G2. This prevents undesired materials from being deposited within the first insulation layer 56 and the second insulation layer 58, which improves isolation between the fins 55 within the fin groups G1 and G2. Moreover, the insulating fins 67 may be formed with greater volumes, which improves isolation between the fin groups G1 and G2. This helps to reduce device defects and improve device performance.

Figure 22:
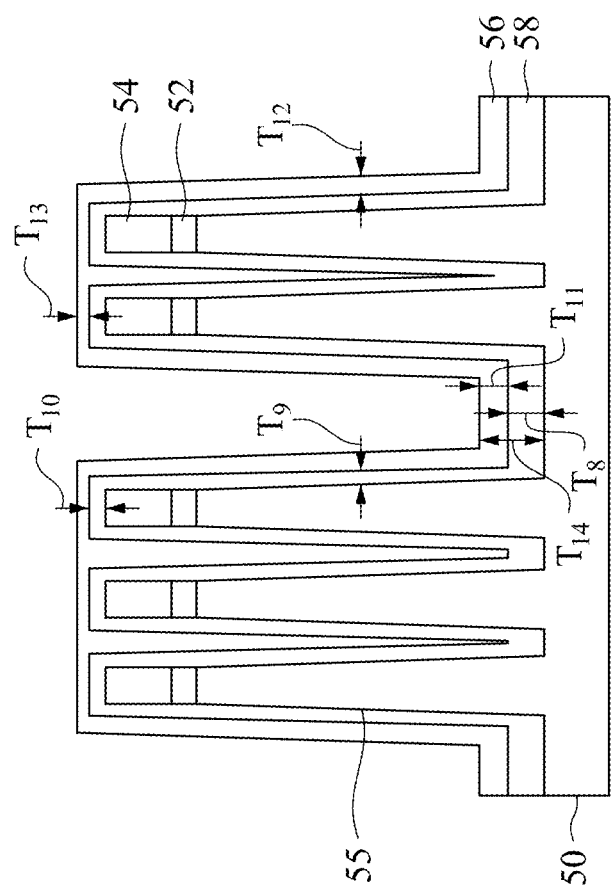
Figures 23A, 23B:
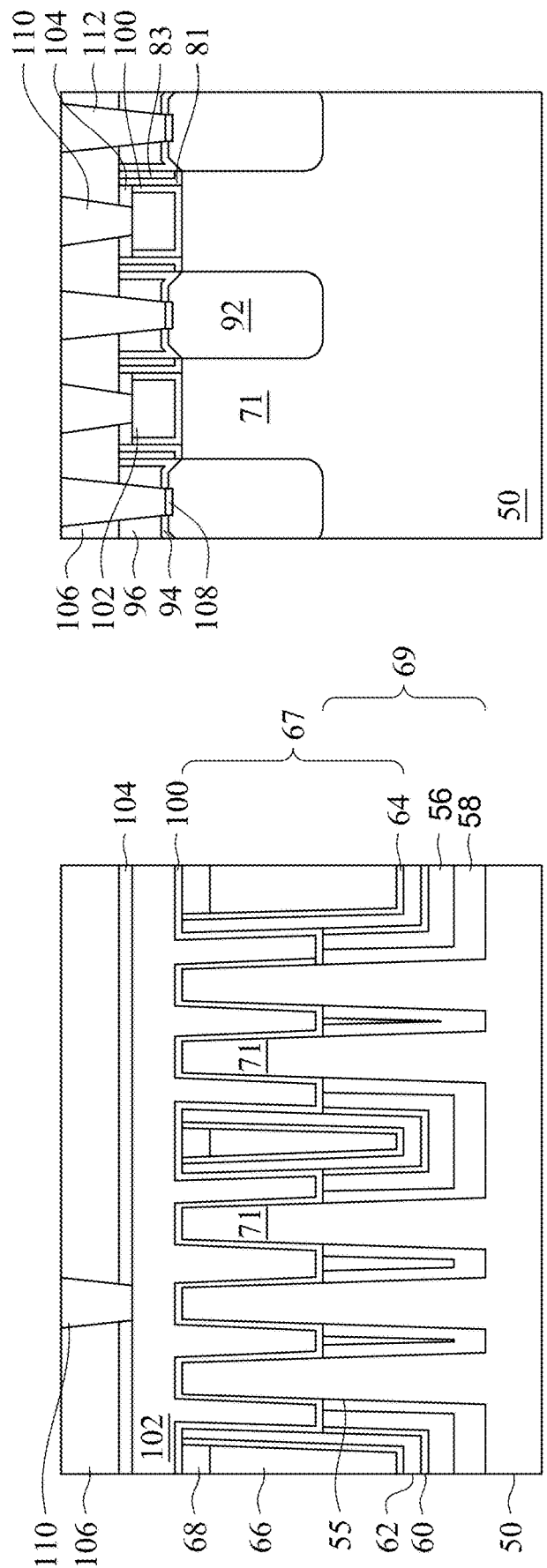

FIGS. 22 through 23B illustrate an embodiment in which the deposition order for the first insulation layer 56 and the second insulation layer 58 is reversed. In FIG. 22, the second insulation layer 58 is deposited on the fins 55, the first mask layer 52, the second mask layer 54, and the substrate 50 and the first insulation layer 56 is deposited on the second insulation layer 58. The second insulation layer 58 and the first insulation layer 56 may be oxides, nitrides, oxynitrides, combinations thereof, or the like. In some embodiments, either of the second insulation layer 58 and the first insulation layer 56 include silicon dioxide ($SiO_2$), silicon nitride ($Si_3N_4$), silicon oxynitride (SiON), or the like. The second insulation layer 58 and the first insulation layer 56 may be deposited by FCVD processes (e.g., contouring FCVD processes) or the like. FCVD processes are a CVD-based material deposition in a remote plasma system followed by a post-deposition cure to convert the deposited material to another material, such as an oxide. The second insulation layer 58 and the first insulation layer 56 may be deposited as silicon nitride or silicon oxynitride and converted to silicon oxide by the post-deposition cure.

Process parameters used to deposit the second insulation layer 58 and the first insulation layer 56 may be different from one another. For example, the second insulation layer 58 may be deposited by an FCVD process that deposits material with a relatively lower viscosity and as a more conformal layer. This helps to deposit the second insulation layer 58 on the fins 55, the first mask layer 52, the second mask layer 54, and the substrate 50 within the fin groups G1 and G2, while keeping a combined thickness of the second insulation layer 58 and the first insulation layer 56 on the substrate 50 between the fin groups G1 and G2 to a minimum. The first insulation layer 56 may be deposited by an FCVD process that deposits material with a relatively higher viscosity, a higher flowability, and better gap-filling. The first insulation layer 56 may be deposited in a bottom-up manner. This helps the first insulation layer 56 to fill the trenches between the fins 55 within the fin groups G1 and G2, but also increases the thickness of the first insulation layer 56 on the substrate 50 between the fin groups G1 and G2. By using FCVD to deposit both the second insulation layer 58 and the first insulation layer 56, the second insulation layer 58 and the first insulation layer 56 are deposited without voids or seams. This prevents undesired materials from filling any voids or seams in the second insulation layer 58 and the first insulation layer 56, which reduces device defects and improves device performance. Using different process parameters to deposit the second insulation layer 58 and the first insulation layer 56 further ensures a small thickness of the second insulation layer 58 and the first insulation layer 56 on the substrate 50 between the fin groups G1 and G2, which allows for larger insulating fins to be formed between the fin groups G1 and G2. This further improves device performance.

The second insulation layer 58 and the first insulation layer 56 may be deposited with process parameters similar to or the same as those discussed above with respect to FIG. 4, except that the order of deposition is reversed. For example, the second insulation layer 58 is deposited on the fins 55, the first mask layer 52, the second mask layer 54, and the substrate 50. The silicon-containing precursor and the nitrogen-containing precursor mix and react to deposit the second insulation layer 58 on the fins 55, the first mask layer 52, the second mask layer 54, and the substrate 50. In some embodiments, the silicon-containing precursor is dispensed at a flow rate in a range from about 800 sccm to about 1000 sccm and the nitrogen-containing precursor is dispensed at a flow rate in a range from about 20 sccm to about 30 sccm. A ratio of the flow rate of the nitrogen-containing precursor to the flow rate of the silicon-containing precursor may be in a range from about 0.02 to about 0.04. The FCVD process may be performed at a low pressure. For example, the deposition chamber may be maintained at a pressure ranging from about 0.4 Torr to about 0.9 Torr. In some embodiments, the deposition chamber is maintained at a temperature in a range from about 55° C. to about 85° C., the substrate 50 on which the second insulation layer 56 is deposited is maintained at a temperature in a range from about 55° C. to about 85° C., and the deposition rate of the second insulation layer 56 may be in a range from about 2 Å/s to about 10 Å/s. Performing the FCVD process with the specified process conditions (e.g., precursor flow rates, pressure, temperature, etc.) allows the flowable material to be deposited as a conformal layer. This helps to fill the trenches between the fins 55 within the fin groups G1 and G2, while maintaining a minimal thickness of the second insulation layer 58 on the substrate 50 between the fin groups G1 and G2. The second insulation layer 58 may be deposited with a thickness $T_8$ on the substrate in a range from about 5 nm to about 8 nm, a thickness $T_9$ on side surfaces of the fins 55 in a range from about 2 nm to about 4 nm, and a thickness $T_{10}$ on top surfaces of the second mask layer 54 in a range from about 2 to about 4 nm.

The first insulation layer 56 is deposited on the second insulation layer 58. The silicon-containing precursor and the nitrogen-containing precursor mix and react to deposit the first insulation layer 56 on the second insulation layer 58. In some embodiments, the silicon-containing precursor is dispensed at a flow rate in a range from about 800 sccm to about 1000 sccm and the nitrogen-containing precursor is dispensed at a flow rate in a range from about 40 sccm to about 80 sccm. A ratio of the flow rate of the nitrogen-containing precursor to the flow rate of the silicon-containing precursor may be in a range from about 0.04 to about 0.10. The FCVD process may be performed at a low pressure. For example, the deposition chamber may be maintained at a pressure ranging from about 0.4 Torr to about 0.9 Torr. In some embodiments, the deposition chamber is maintained at a temperature in a range from about 55° C. to about 85° C., the substrate 50 on which the first insulation layer 56 is deposited is maintained at a temperature in a range from about 55° C. to about 85° C., and the deposition rate of the first insulation layer 56 may be in a range from about 2 Å/s to about 10 Å/s. Performing the FCVD process with the specified process conditions (e.g., precursor flow rates, pressure, temperature, etc.) allows the flowable material to be deposited with a high viscosity (previously described). This helps to fill the trenches between the fins 55 within the fin groups G1 and G2 in a bottom-up manner and with improved gap filling. The first insulation layer 56 may be deposited with a thickness $T_{11}$ on the substrate in a range from about 5 nm to about 10 nm, a thickness $T_{12}$ on side surfaces of the fins 55 in a range from about 2 nm to about 4 nm, and a thickness $T_{13}$ on top surfaces of the second mask layer 54 in a range from about 2 nm to about 4 nm. A thickness $T_{14}$ of the second insulation layer 58 and the first insulation layer 56 on the substrate 50 between the fin groups G1 and G2 may be in a range from about 10 nm to about 18 nm. As illustrated in FIG. 22, the second insulation layer 58 and the first insulation layer 56 fill the trenches between the fins 55 within the fin groups G1 and G2.

The second insulation layer 58 and the first insulation layer 56 may be deposited as flowable materials, which are then cured to form solid dielectric materials, as described above with respect to FIG. 4. It is appreciated that depending on the material and the composition (elements and the percentage of elements), the second insulation layer 58 may be, or may not be, distinguishable from the first insulation layer 56. For example, either of the first insulation layer 56 and the second insulation layer 58 may or may not include elements such as carbon, hydrogen, nitrogen, or the like in additional to silicon and oxygen. Furthermore, the density of the second insulation layer 58 may be lower than, equal to, or higher than that of the first insulation layer 56. The distinction between the second insulation layer 58 and the first insulation layer 56 may be achieved by determining the elements and the corresponding atomic percentages of the elements in these layers/materials, for example, by using X-ray Photoelectron Spectroscopy (XPS).

FIGS. 23A and 23B illustrate structures similar to or the same as the structures illustrated in FIGS. 21A and 21B, except that the second insulation layer 58 and the first insulation layer 56 are deposited in the opposite order. Processes similar to or the same as those discussed with respect to FIGS. 5 through 21B may be performed on the structure of FIG. 22 to form the structures of FIGS. 23A and 23B.

Embodiments may achieve various advantages. For example, forming the first insulation layer 56 and the second insulation layer 58 by FCVD using the process parameters discussed above ensures that the first insulation layer 56 and the second insulation layer 58 fill gaps between the fins 55 within the fin groups G1 and G2 without seams or voids and that the first insulation layer 56 and the second insulation layer 58 have a minimal thickness between and adjacent to the fin groups G1 and G2. This prevents undesired materials from being deposited within the first insulation layer 56 and the second insulation layer 58, which improves isolation between the fins 55 within the fin groups G1 and G2. Moreover, the insulating fins 67 may be formed with greater volumes, which improves isolation between the fin groups G1 and G2. This helps to reduce device defects and improve device performance.

The disclosed FinFET embodiments could also be applied to nanostructure devices such as nanostructure (e.g., nanosheet, nanowire, nano-ribbon, multi-bridge-channel, gate-all-around, or the like) field effect transistors (NS-FETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers are partially or fully removed in channel regions. The replacement gate structures are formed in a manner similar to the above-described embodiments. The replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments.

In accordance with an embodiment, a method includes etching a first trench in a substrate; depositing a first insulation layer in the first trench with a first flowable chemical vapor deposition process; depositing a second insulation layer on the first insulation layer with a second flowable chemical vapor deposition process, the second flowable chemical vapor deposition process having process parameters different from the first flowable chemical vapor deposition process, and a portion of the first trench remaining unfilled by the first insulation layer and the second insulation layer; and forming an insulating fin in the portion of the first trench unfilled by the first insulation layer and the second insulation layer. In an embodiment, the first insulation layer and the second insulation layer include silicon dioxide. In an embodiment, the first flowable chemical vapor deposition process and the second flowable chemical vapor deposition process include exposing the substrate to trisilylamine and ammonia. In an embodiment, the first flowable chemical vapor deposition process includes dispensing trisilylamine in a deposition chamber at a first flow rate in a range from 800 sccm to 1000 sccm and dispensing ammonia in the deposition chamber at a second flow rate in a range from 40 sccm to 80 sccm, and the second flowable chemical vapor deposition process includes dispensing trisilylamine in the deposition chamber at a third flow rate in a range from 800 sccm to 1000 sccm and dispensing ammonia in the deposition chamber at a fourth flow rate in a range from 20 sccm to 30 sccm. In an embodiment, the first flowable chemical vapor deposition process includes dispensing trisilylamine in a deposition chamber at a first flow rate in a range from 800 sccm to 1000 sccm and dispensing ammonia in the deposition chamber at a second flow rate in a range from 20 sccm to 30 sccm, and the second flowable chemical vapor deposition process includes dispensing trisilylamine in the deposition chamber at a third flow rate in a range from 800 sccm to 1000 sccm and dispensing ammonia in the deposition chamber at a fourth flow rate in a range from 40 sccm to 80 sccm. In an embodiment, the first insulation layer is formed with a first thickness on a bottom surface of the first trench in a first direction perpendicular to a major surface of the substrate, the first insulation layer is formed with a second thickness on a side surface of the first trench in a second direction parallel to the major surface of the substrate, the second insulation layer is formed with a third thickness on the bottom surface of the first trench in the first direction, the second insulation layer is formed with a fourth thickness on the side surface of the first trench in the second direction, and a ratio of the second thickness to the first thickness is less than a ratio of the fourth thickness to the third thickness. In an embodiment, the first insulation layer is formed with a first thickness on a bottom surface of the first trench in a first direction perpendicular to a major surface of the substrate, the first insulation layer is formed with a second thickness on a side surface of the first trench in a second direction parallel to the major surface of the substrate, the second insulation layer is formed with a third thickness on the bottom surface of the first trench in the first direction, the second insulation layer is formed with a fourth thickness on the side surface of the first trench in the second direction, and a ratio of the second thickness to the first thickness is greater than a ratio of the fourth thickness to the third thickness. In an embodiment, the method further includes etching a second trench and a third trench in the substrate, the first insulation layer being deposited to fill the second trench, and the first insulation layer and the second insulation layer being deposited to fill the third trench.

In accordance with another embodiment, a method includes forming a plurality of fins on a substrate, a first trench and a second trench being formed adjacent the fins; depositing a first oxide layer on the substrate by a first flowable chemical vapor deposition (FCVD), the first oxide layer filling the first trench, the first oxide layer partially filling the second trench, and a first width of the first trench being less than a second width of the second trench; and depositing a second oxide layer on the first oxide layer by a second FCVD, the second oxide layer filling a remaining portion of the second trench. In an embodiment, the first oxide layer is deposited in contact with the fins and the substrate, and the second oxide layer is deposited in contact with the first oxide layer. In an embodiment, the method further includes depositing a third oxide layer over and in contact with the second oxide layer by atomic layer deposition (ALD). In an embodiment, precursors for depositing the first oxide layer and depositing the second oxide layer include trisilylamine and ammonia, and the first oxide layer is deposited with a different ammonia flow rate from the second oxide layer. In an embodiment, the first oxide layer is deposited with a first ammonia flow rate in a range from 40 sccm to 80 sccm, and the second oxide layer is deposited with a second ammonia flow rate in a range from 20 sccm to 30 sccm. In an embodiment, a first height to width ratio of the first trench is from 20 to 70, and wherein a second height to width ratio of the second trench is from 18 to 35.

In accordance with yet another embodiment, a method includes forming a plurality of trenches in a substrate, a plurality of fins being formed adjacent the trenches and extending from the substrate; depositing a first oxide layer in the trenches by a first flowable chemical vapor deposition (FCVD); and depositing a second oxide layer on the first oxide layer by a second FCVD, the first oxide layer being deposited with a greater conformality than the second oxide layer. In an embodiment, the first oxide layer is deposited in contact with the fins and the substrate, and the second oxide layer is deposited in contact with the first oxide layer. In an embodiment, precursors for depositing the first oxide layer and depositing the second oxide layer include trisilylamine and ammonia, and the first oxide layer is deposited with a different ammonia flow rate from the second oxide layer. In an embodiment, the first oxide layer is deposited with a first ammonia flow rate in a range from 20 sccm to 30 sccm, and the second oxide layer is deposited with a second ammonia flow rate in a range from 40 sccm to 80 sccm. In an embodiment, a first height to width ratio of a first trench of the trenches is from 18 to 35, wherein a second height to width ratio of a second trench of the trenches is from 20 to 70, the first oxide layer partially fills the first trench and the second trench, and the second oxide layer fills a first remainder of the first trench and a second remainder of the second trench. In an embodiment, the method further includes forming a first isolation fin over the second oxide layer, a combined thickness of the first oxide layer and the second oxide layer under the first isolation fin in a direction perpendicular to a major surface of the substrate being less than 18 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a first trench in a substrate;
   depositing a first insulation layer in the first trench with a first flowable chemical vapor deposition process;
   depositing a second insulation layer on the first insulation layer with a second flowable chemical vapor deposition process, wherein the second flowable chemical vapor deposition process has process parameters different from the first flowable chemical vapor deposition process, and wherein a portion of the first trench remains unfilled by the first insulation layer and the second insulation layer;
   forming an insulating fin in the portion of the first trench unfilled by the first insulation layer and the second insulation layer; and
   etching a second trench and a third trench in the substrate, wherein the first insulation layer is deposited to fill the second trench, and wherein the first insulation layer and the second insulation layer are deposited to fill the third trench.

2. The method of claim 1, wherein the first insulation layer and the second insulation layer comprise silicon dioxide.

3. The method of claim 1, wherein the first flowable chemical vapor deposition process and the second flowable chemical vapor deposition process comprise exposing the substrate to trisilylamine and ammonia.

4. The method of claim 3, wherein the first flowable chemical vapor deposition process comprises dispensing trisilylamine in a deposition chamber at a first flow rate in a range from 800 sccm to 1000 sccm and dispensing ammonia in the deposition chamber at a second flow rate in a range from 40 sccm to 80 sccm, and wherein the second flowable chemical vapor deposition process comprises dispensing trisilylamine in the deposition chamber at a third flow rate in a range from 800 sccm to 1000 sccm and dispensing ammonia in the deposition chamber at a fourth flow rate in a range from 20 sccm to 30 sccm.

5. The method of claim 3, wherein the first flowable chemical vapor deposition process comprises dispensing trisilylamine in a deposition chamber at a first flow rate in a range from 800 sccm to 1000 sccm and dispensing ammonia in the deposition chamber at a second flow rate in a range from 20 sccm to 30 sccm, and wherein the second flowable chemical vapor deposition process comprises dispensing trisilylamine in the deposition chamber at a third flow rate in a range from 800 sccm to 1000 sccm and dispensing ammonia in the deposition chamber at a fourth flow rate in a range from 40 sccm to 80 sccm.

6. The method of claim 1, wherein the first insulation layer is formed with a first thickness on a bottom surface of the first trench in a first direction perpendicular to a major surface of the substrate, wherein the first insulation layer is formed with a second thickness on a side surface of the first trench in a second direction parallel to the major surface of the substrate, wherein the second insulation layer is formed with a third thickness on the bottom surface of the first trench in the first direction, wherein the second insulation layer is formed with a fourth thickness on the side surface of the first trench in the second direction, and wherein a ratio of the second thickness to the first thickness is less than a ratio of the fourth thickness to the third thickness.

7. The method of claim 1, wherein the first insulation layer is formed with a first thickness on a bottom surface of the first trench in a first direction perpendicular to a major surface of the substrate, wherein the first insulation layer is formed with a second thickness on a side surface of the first trench in a second direction parallel to the major surface of the substrate, wherein the second insulation layer is formed with a third thickness on the bottom surface of the first trench in the first direction, wherein the second insulation layer is formed with a fourth thickness on the side surface of the first trench in the second direction, and wherein a ratio of the second thickness to the first thickness is greater than a ratio of the fourth thickness to the third thickness.

8. The method of claim 1, wherein forming the insulating fin comprises:
depositing a first insulation material having a different etch selectivity from the first insulation layer and the second insulation layer; and
depositing a second insulation material on the first insulation material, the second insulation material comprising a high-k dielectric material.

9. A method comprising:
forming a plurality of fins on a substrate, wherein a first trench and a second trench are formed adjacent the fins;
depositing a first oxide layer on the substrate by a first flowable chemical vapor deposition (FCVD), wherein the first oxide layer fills the first trench, wherein the first oxide layer partially fills the second trench, and wherein a first width of the first trench is less than a second width of the second trench, wherein the first oxide layer is formed with a first thickness on a bottom surface of the second trench in a first direction perpendicular to a major surface of the substrate, wherein the first oxide layer is formed with a second thickness on a side surface of the second trench in a second direction parallel to the major surface of the substrate; and
depositing a second oxide layer on the first oxide layer by a second FCVD, wherein the second oxide layer fills a remaining portion of the second trench, wherein the second oxide layer is formed with a third thickness on the bottom surface of the second trench in the first direction, wherein the second oxide layer is formed with a fourth thickness on the side surface of the second trench in the second direction, and wherein a ratio of the second thickness to the first thickness is less than a ratio of the fourth thickness to the third thickness.

10. The method of claim 9, wherein the first oxide layer is deposited in contact with the fins and the substrate, and wherein the second oxide layer is deposited in contact with the first oxide layer.

11. The method of claim 10, further comprising depositing a third oxide layer over and in contact with the second oxide layer by atomic layer deposition (ALD).

12. The method of claim 9, wherein precursors for depositing the first oxide layer and depositing the second oxide layer comprise trisilylamine and ammonia, and wherein the first oxide layer is deposited with a different ammonia flow rate from the second oxide layer.

13. The method of claim 12, wherein the first oxide layer is deposited with a first ammonia flow rate in a range from 40 sccm to 80 sccm, and wherein the second oxide layer is deposited with a second ammonia flow rate in a range from 20 sccm to 30 sccm.

14. The method of claim 9, wherein a first height to width ratio of the first trench is from 20 to 70, and wherein a second height to width ratio of the second trench is from 18 to 35.

15. A method comprising:
forming a plurality of trenches in a substrate, wherein a plurality of fins is formed adjacent the trenches and extending from the substrate;
depositing a first oxide layer in the trenches by a first flowable chemical vapor deposition (FCVD); and
depositing a second oxide layer on the first oxide layer by a second FCVD, wherein the first oxide layer is deposited with a greater conformality than the second oxide layer, wherein a first height to width ratio of a first trench of the trenches is from 18 to 35, wherein a second height to width ratio of a second trench of the trenches is from 20 to 70, wherein the first oxide layer partially fills the first trench and the second trench, and wherein the second oxide layer fills a first remainder of the first trench and a second remainder of the second trench.

16. The method of claim 15, wherein the first oxide layer is deposited in contact with the fins and the substrate, and wherein the second oxide layer is deposited in contact with the first oxide layer.

17. The method of claim 15, wherein precursors for depositing the first oxide layer and depositing the second oxide layer comprise trisilylamine and ammonia, and wherein the first oxide layer is deposited with a different ammonia flow rate from the second oxide layer.

18. The method of claim 17, wherein the first oxide layer is deposited with a first ammonia flow rate in a range from 20 sccm to 30 sccm, and wherein the second oxide layer is deposited with a second ammonia flow rate in a range from 40 sccm to 80 sccm.

19. The method of claim 15, further comprising forming a first isolation fin over the second oxide layer, wherein a combined thickness of the first oxide layer and the second oxide layer under the first isolation fin in a direction perpendicular to a major surface of the substrate is less than 18 nm.

20. The method of claim 15, further comprising:
recessing the first oxide layer and the second oxide layer to form shallow trench isolation (STI) regions, wherein upper portions of the fins protrude from the STI regions;
forming dummy gate structures over channel regions of the fins;
forming epitaxial source/drain regions in the fins adjacent to the dummy gate structures; and
replacing the dummy gate structures with metal gate structures.

* * * * *